(12) United States Patent
Kao et al.

(10) Patent No.: US 7,767,024 B2
(45) Date of Patent: *Aug. 3, 2010

(54) METHOD FOR FRONT END OF LINE FABRICATION

(75) Inventors: Chien-Teh Kao, Sunnyvale, CA (US); Jing-Pei (Connie) Chou, Sunnyvale, CA (US); Chiukin (Steven) Lai, Sunnyvale, CA (US); Sal Umotoy, Antioch, CA (US); Joel M. Huston, San Jose, CA (US); Son Trinh, Cupertino, CA (US); Mei Chang, Saragoga, CA (US); Xiaoxiong (John) Yuan, San Jose, CA (US); Yu Chang, San Jose, CA (US); Xinliang Lu, Sunnyvale, CA (US); Wei W. Wang, Santa Clara, CA (US); See-Eng Phan, San Jose, CA (US)

(73) Assignee: Appplied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/134,715

(22) Filed: Jun. 6, 2008

(65) Prior Publication Data
US 2008/0268645 A1  Oct. 30, 2008

Related U.S. Application Data

(60) Continuation of application No. 11/137,609, filed on May 24, 2005, now Pat. No. 7,396,480, which is a division of application No. 11/063,645, filed on Feb. 22, 2005.

(60) Provisional application No. 60/547,839, filed on Feb. 26, 2004.

(51) Int. Cl.
*H01L 21/302* (2006.01)

(52) U.S. Cl. ............... 134/1.2; 216/67; 438/715
(58) Field of Classification Search ............... None
See application file for complete search history.

(56) References Cited

U.S. PATENT DOCUMENTS 4,209,357 A   6/1980  Gorin et al.

(Continued)

FOREIGN PATENT DOCUMENTS

CN    1375575    10/2002

(Continued)

OTHER PUBLICATIONS

Prosecution History for U.S. Appl. No. 11/622,437.

(Continued)

*Primary Examiner*—Michael Kornakov
*Assistant Examiner*—Ryan Coleman
(74) *Attorney, Agent, or Firm*—Patterson & Sheridan, LLP

(57) ABSTRACT

In one embodiment, a method for removing native oxides from a substrate surface is provided which includes supporting a substrate containing silicon oxide within a processing chamber, generating a plasma of reactive species from a gas mixture within the processing chamber, cooling the substrate to a first temperature of less than about 65° C. within the processing chamber, and directing the reactive species to the cooled substrate to react with the silicon oxide thereon while forming a film on the substrate. The film usually contains ammonium hexafluorosilicate. The method further provides positioning the substrate in close proximity to a gas distribution plate, and heating the substrate to a second temperature of about 100° C. or greater within the processing chamber to sublimate or remove the film. The gas mixture may contain ammonia, nitrogen trifluoride, and a carrier gas.

28 Claims, 11 Drawing Sheets

U.S. PATENT DOCUMENTS

| | | | |
|---|---|---|---|
| 4,565,601 A | 1/1986 | Kakehi et al. | |
| 4,579,618 A | 4/1986 | Celestino et al. | |
| 4,585,920 A | 4/1986 | Hoog et al. | |
| 4,807,016 A | 2/1989 | Douglas | |
| 4,872,947 A * | 10/1989 | Wang et al. | 216/38 |
| 4,886,570 A | 12/1989 | Davis et al. | |
| 4,892,753 A | 1/1990 | Wang et al. | |
| 4,951,601 A | 8/1990 | Maydan et al. | |
| 4,985,372 A | 1/1991 | Narita et al. | |
| 5,000,113 A | 3/1991 | Wang et al. | |
| 5,030,319 A | 7/1991 | Nishino et al. | |
| 5,089,441 A | 2/1992 | Moslehi | |
| 5,186,718 A | 2/1993 | Tepman et al. | |
| 5,198,034 A | 3/1993 | deBoer et al. | |
| 5,228,501 A | 7/1993 | Tepman et al. | |
| 5,231,690 A | 7/1993 | Soma et al. | |
| 5,238,499 A | 8/1993 | van de Ven et al. | |
| 5,282,925 A * | 2/1994 | Jeng et al. | 216/59 |
| 5,328,558 A | 7/1994 | Kawamura et al. | |
| 5,345,999 A | 9/1994 | Hosokawa | |
| 5,352,636 A | 10/1994 | Beinglass | |
| 5,368,897 A | 11/1994 | Kurihara et al. | |
| 5,382,311 A | 1/1995 | Ishikawa et al. | |
| 5,403,434 A | 4/1995 | Moslehi | |
| 5,451,259 A | 9/1995 | Krogh | |
| 5,500,249 A | 3/1996 | Telford et al. | |
| 5,505,816 A | 4/1996 | Barnes et al. | |
| 5,516,367 A | 5/1996 | Lei et al. | |
| 5,531,835 A | 7/1996 | Fodor et al. | |
| 5,549,780 A | 8/1996 | Koinuma et al. | |
| 5,560,779 A | 10/1996 | Knowles et al. | |
| 5,578,130 A | 11/1996 | Hayashi et al. | |
| 5,716,500 A | 2/1998 | Bardos et al. | |
| 5,716,506 A | 2/1998 | Maclay et al. | |
| 5,800,686 A | 9/1998 | Littau et al. | |
| 5,812,403 A | 9/1998 | Fong et al. | |
| 5,844,195 A | 12/1998 | Fairbairn et al. | |
| 5,846,332 A | 12/1998 | Zhao et al. | |
| 5,846,375 A | 12/1998 | Gilchrist et al. | |
| 5,855,681 A | 1/1999 | Maydan et al. | |
| 5,856,240 A | 1/1999 | Sinha et al. | |
| 5,885,404 A | 3/1999 | Kim et al. | |
| 5,899,752 A | 5/1999 | Hey et al. | |
| 5,942,075 A | 8/1999 | Nagahata et al. | |
| 5,951,601 A | 9/1999 | Lesinski et al. | |
| 5,951,776 A | 9/1999 | Selyutin et al. | |
| 5,993,916 A | 11/1999 | Zhao et al. | |
| 6,035,101 A | 3/2000 | Sajoto et al. | |
| 6,083,344 A | 7/2000 | Hanawa et al. | |
| 6,086,677 A | 7/2000 | Umotoy et al. | |
| 6,152,070 A * | 11/2000 | Fairbairn et al. | 118/719 |
| 6,176,198 B1 | 1/2001 | Kao et al. | |
| 6,177,245 B1 | 1/2001 | Ward et al. | |
| 6,179,924 B1 | 1/2001 | Zhao et al. | |
| 6,189,484 B1 * | 2/2001 | Yin et al. | 118/723 I |
| 6,238,513 B1 | 5/2001 | Arnold et al. | |
| 6,241,845 B1 | 6/2001 | Gadgil et al. | |
| 6,350,320 B1 | 2/2002 | Sherstinsky et al. | |
| 6,364,949 B1 | 4/2002 | Or et al. | |
| 6,364,954 B2 | 4/2002 | Umotoy et al. | |
| 6,364,957 B1 | 4/2002 | Schneider et al. | |
| 6,372,657 B1 | 4/2002 | Hineman et al. | |
| 6,446,572 B1 | 9/2002 | Brcka | |
| 6,448,537 B1 | 9/2002 | Nering | |
| 6,494,959 B1 | 12/2002 | Samoilov et al. | |
| 6,500,728 B1 | 12/2002 | Wang et al. | |
| 6,506,291 B2 | 1/2003 | Tsai et al. | |
| 6,544,340 B2 | 4/2003 | Yudovsky | |
| 6,603,269 B1 | 8/2003 | Vo et al. | |
| 6,635,185 B2 | 10/2003 | Demmin et al. | |
| 6,638,810 B2 | 10/2003 | Bakli et al. | |
| 6,645,301 B2 | 11/2003 | Sainty et al. | |
| 6,656,831 B1 | 12/2003 | Lee et al. | |
| 6,670,278 B2 | 12/2003 | Li et al. | |
| 6,679,981 B1 | 1/2004 | Pan et al. | |
| 6,740,585 B2 | 5/2004 | Yoon et al. | |
| 6,800,830 B2 | 10/2004 | Mahawili | |
| 6,808,564 B2 | 10/2004 | Dietze | |
| 6,878,206 B2 | 4/2005 | Tzu et al. | |
| 6,879,981 B2 | 4/2005 | Rothschild et al. | |
| 6,911,401 B2 | 6/2005 | Khandan et al. | |
| 6,958,286 B2 | 10/2005 | Chen et al. | |
| 6,960,781 B2 | 11/2005 | Currie et al. | |
| 7,049,200 B2 | 5/2006 | Arghavani et al. | |
| 7,122,949 B2 | 10/2006 | Strikovski | |
| 7,253,123 B2 | 8/2007 | Arghavani et al. | |
| 7,256,370 B2 | 8/2007 | Guiver | |
| 7,396,480 B2 | 7/2008 | Kao et al. | |
| 2001/0015261 A1 | 8/2001 | Kobayashi et al. | |
| 2002/0011210 A1 | 1/2002 | Satoh et al. | |
| 2002/0029747 A1 | 3/2002 | Powell et al. | |
| 2002/0033233 A1 | 3/2002 | Savas | |
| 2003/0019428 A1 | 1/2003 | Ku et al. | |
| 2003/0029566 A1 | 2/2003 | Roth | |
| 2003/0038127 A1 | 2/2003 | Liu et al. | |
| 2003/0047282 A1 * | 3/2003 | Sago et al. | 156/345.34 |
| 2003/0072639 A1 | 4/2003 | White et al. | |
| 2003/0079686 A1 | 5/2003 | Chen et al. | |
| 2003/0098125 A1 | 5/2003 | An | |
| 2003/0116087 A1 | 6/2003 | Nguyen et al. | |
| 2003/0129106 A1 | 7/2003 | Sorensen et al. | |
| 2003/0132319 A1 | 7/2003 | Hytros et al. | |
| 2003/0173347 A1 | 9/2003 | Guiver | |
| 2003/0221780 A1 | 12/2003 | Lei et al. | |
| 2003/0227013 A1 | 12/2003 | Currie et al. | |
| 2004/0005726 A1 | 1/2004 | Huang | |
| 2004/0069225 A1 | 4/2004 | Fairbairn et al. | |
| 2004/0070346 A1 | 4/2004 | Choi | |
| 2004/0182315 A1 | 9/2004 | Laflamme et al. | |
| 2004/0194799 A1 | 10/2004 | Kim et al. | |
| 2004/0219789 A1 | 11/2004 | Wood et al. | |
| 2005/0205110 A1 | 9/2005 | Kao et al. | |
| 2005/0218507 A1 | 10/2005 | Kao et al. | |
| 2005/0221552 A1 | 10/2005 | Kao et al. | |
| 2005/0230350 A1 | 10/2005 | Kao et al. | |
| 2006/0051968 A1 | 3/2006 | Joshi et al. | |
| 2006/0130971 A1 | 6/2006 | Chang et al. | |
| 2006/0185592 A1 | 8/2006 | Matsuura | |
| 2007/0087573 A1 | 4/2007 | Chiang et al. | |
| 2008/0160210 A1 | 7/2008 | Yang et al. | |

FOREIGN PATENT DOCUMENTS

| | | |
|---|---|---|
| CN | 1 822328 | 8/2006 |
| EP | 0 376 252 | 7/1990 |
| EP | 0 658 928 | 10/1994 |
| EP | 1099776 | 5/2001 |
| EP | 1107288 | 6/2001 |
| EP | 1 568 797 | 8/2005 |
| JP | 02256235 | 10/1990 |
| JP | 10154699 | 6/1998 |
| JP | 2000-208498 | 7/2000 |
| JP | 2001-053055 | 2/2001 |
| JP | 2002100578 | 4/2002 |
| JP | 2003019433 | 1/2003 |
| JP | 2003059914 | 2/2003 |
| JP | 2003-133284 | 5/2003 |
| JP | 2003217898 | 7/2003 |
| KR | 10-0593740 | 6/2006 |
| WO | WO-2004006303 | 1/2004 |

| | | |
|---|---|---|
| WO | WO-2004074932 | 9/2004 |

OTHER PUBLICATIONS

Notification of First Office Action dated Mar. 20, 2009 for Chinese Patent Application No. 2008100007537.
PCT International Search Report and Written Opinion dated Jun. 23, 2009 for International Application No. PCT/US2008/087436.
Wang et al.; Ultra High-selectivity silicon nitride etch process using an inductively coupled plasma source; J. Vac. Sci. Technol. A 16(3), May/Jun. 1998, pp. 1582-1587.
Hashim et al.; Characterization of thin oxide removal by RTA Treatment; ICSE 1998 Proc. Nov. 1998, Rangi, Malaysia, pp. 213-216.
Wolf et al.; Silicon Processing for the VLSI Era; vol. 1; 1986; Lattice Press, pp. 546, 547, 618, 619.
European Search Report dated May 23, 2006 for EP Application No. 05251143.3.
European Search Report dated Sep. 1, 2006 for EP Application No. 05251143.3.
S.M. Sze, VLSI Technology, McGraw-Hill Book Company, pp. 107, 108.
Ogawa, Hiroki, et al.; Dry Cleaning Technology for Removal of Silicon Native Oxide Employing Hot $NH_3/NF_3$ Exposure, Jpn. J. Appl. Phys. vol. 41 (2002) pp. 5349-5358, Part 1, No. 8, Aug. 2002.
International Search Report and Written Opinion of the International Searching Authority mailed Jul. 3, 2008 (PCT/US05/46226).
First Office Action dated Sep. 7, 2007 for Chinese Patent Application No. 2005100565328.
European Examination Report dated Nov. 13, 2007 for EP Application No. 05251143.3.
H. Nishino, N. Hayasaka, and H. Okano, Damage-Free Selective Etching of SI Native Oxides Using $NH_3/NF_3$ and $SF_6/H_2O$ Down-Flow Etching, The Japanese Society of Applied Physics, vol. 74, No. 2, pp. 1345-1348, XP-002491959, Jul. 15, 1993.
EP Partial Search Report, Application No. 08150111.6-1235 / 1944796, dated Aug. 22, 2008.

* cited by examiner

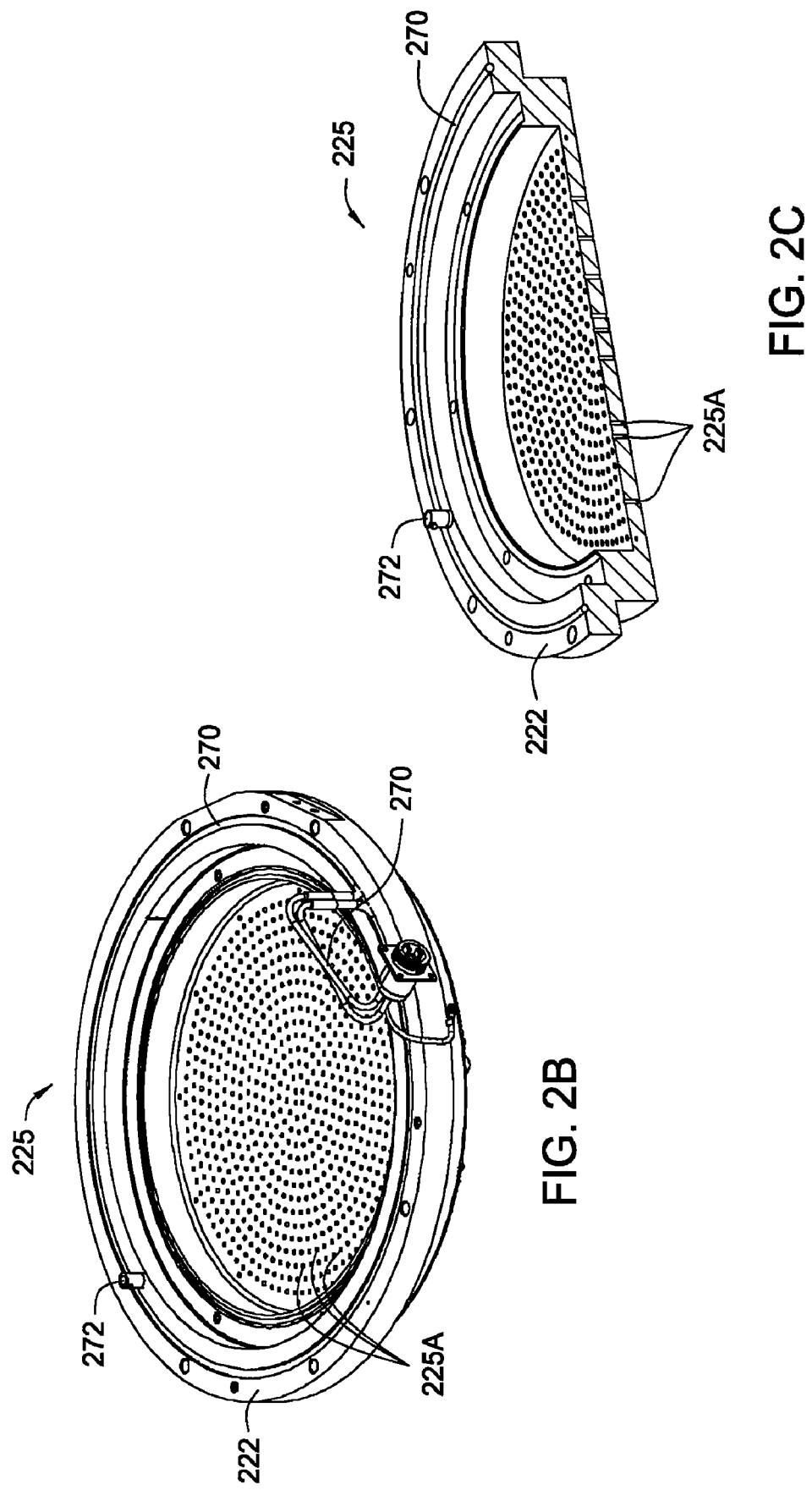

METHOD FOR FRONT END OF LINE FABRICATION

CROSS-REFERENCE TO RELATED APPLICATIONS

This application is a continuation of U.S. Ser. No. 11/137,609, filed May 24, 2005, now issued as U.S. Pat. No. 7,396,480, which is a divisional of U.S. Ser. No. 11/063,645, filed on Feb. 22, 2005, which claims benefit of U.S. Ser. No. 60/547,839, filed Feb. 26, 2004, which are all herein incorporated by reference in their entirety. This application is also related to U.S. patent application Ser. No. 11/137,199, filed May 24, 2005; U.S. patent application Ser. No. 11/266,167, filed Nov. 3, 2005; U.S. patent application Ser. No. 11/622,437, filed Jan. 11, 2007; and U.S. patent application Ser. No. 11/962,791, filed Dec. 21, 2007.

BACKGROUND OF THE INVENTION

1. Field of the Invention

Embodiments of the present invention generally relate to semiconductor processing equipment. More particularly, embodiments of the present invention relate to a chemical vapor deposition (CVD) system for semiconductor fabrication and in situ dry cleaning methods using the same.

2. Description of the Related Art

A native oxide typically forms when a substrate surface is exposed to oxygen. Oxygen exposure occurs when the substrate is moved between processing chambers at atmospheric conditions, or when a small amount of oxygen remaining in a vacuum chamber contacts the substrate surface. Native oxides may also result if the substrate surface is contaminated during etching. Native oxides typically form an undesirable film on the substrate surface. Native oxide films are usually very thin, such as between 5 Å and 20 Å, but thick enough to cause difficulties in subsequent fabrication processes.

Such difficulties usually affect the electrical properties of semiconductor devices formed on the substrate. For example, a particular problem arises when native silicon oxide films are formed on exposed silicon containing layers, especially during processing of Metal Oxide Silicon Field Effect Transistor ("MOSFET") structures. Silicon oxide films are electrically insulating and are undesirable at interfaces with contact electrodes or interconnecting electrical pathways because they cause high electrical contact resistance. In MOSFET structures, the electrodes and interconnecting pathways include silicide layers formed by depositing a refractory metal on bare silicon and annealing the layer to produce the metal silicide layer. Native silicon oxide films at the interface between the substrate and the metal reduce the compositional uniformity of the silicide layer by impeding the diffusional chemical reaction that forms the metal silicide. This results in lower substrate yields and increased failure rates due to overheating at the electrical contacts. The native silicon oxide film can also prevent adhesion of other CVD or sputtered layers which are subsequently deposited on the substrate.

Sputter etch processes have been tried to reduce contaminants in large features or in small features having aspect ratios smaller than about 4:1. However, sputter etch processes can damage delicate silicon layers by physical bombardment. In response, wet etch processes using hydrofluoric acid (HF) and deionized water, for example, have also been tried. Wet etch processes such as this, however, are disadvantageous in today's smaller devices where the aspect ratio exceeds 4:1, and especially where the aspect ratio exceeds 10:1. Particularly, the wet solution cannot penetrate into those sizes of vias, contacts, or other features formed within the substrate surface. As a result, the removal of the native oxide film is incomplete. Similarly, a wet etch solution, if successful in penetrating a feature of that size, is even more difficult to remove from the feature once etching is complete.

Another approach for eliminating native oxide films is a dry etch process, such as one utilizing fluorine-containing gases. One disadvantage to using fluorine-containing gases, however, is that fluorine is typically left behind on the substrate surface. Fluorine atoms or fluorine radicals left behind on the substrate surface can be detrimental. For example, the fluorine atoms left behind can continue to etch the substrate causing voids therein.

A more recent approach to remove native oxide films has been to form a fluorine/silicon-containing salt on the substrate surface that is subsequently removed by thermal anneal. In this approach, a thin layer of the salt is formed by reacting a fluorine-containing gas with the silicon oxide surface. The salt is then heated to an elevated temperature sufficient to dissociate the salt into volatile by-products which are then removed from the processing chamber. The formation of a reactive fluorine-containing gas is usually assisted by thermal addition or by plasma energy. The salt is usually formed at a reduced temperature that requires cooling of the substrate surface. This sequence of cooling followed by heating is usually accomplished by transferring the substrate from a cooling chamber where the substrate is cooled to a separate anneal chamber or furnace where the substrate is heated.

For various reasons, this reactive fluorine processing sequence is not desirable. Namely, wafer throughput is greatly diminished because of the time involved to transfer the wafer. Also, the wafer is highly susceptible to further oxidation or other contamination during the transfer. Moreover, the cost of ownership is doubled because two separate chambers are needed to complete the oxide removal process.

There is a need, therefore, for a processing chamber capable of remote plasma generation, heating and cooling, and thereby capable of performing a single dry etch process in a single chamber.

SUMMARY OF THE INVENTION

A method for removing native oxides from a substrate surface is provided. In at least one embodiment, the method includes supporting the substrate surface in a vacuum chamber and generating reactive species from a gas mixture within the chamber. The substrate surface is then cooled within the chamber and the reactive species are directed to the cooled substrate surface to react with the native oxides thereon and form a film on the substrate surface. The substrate surface is then heated within the chamber to vaporize or remove the film.

In at least one other embodiment, the method includes generating a plasma of reactive species in a first section of the chamber and cooling the substrate surface having the native oxides thereon in a second section of the chamber. Reactive species from the first section flow to the second section to react with the cooled substrate surface. A film is deposited on the cooled substrate surface, and the substrate surface is moved to a third section of the chamber. The substrate surface is then heated in the third section of the chamber to sublimate or remove the film.

In yet another embodiment, the method includes generating a plasma of reactive species comprising nitrogen and fluorine atoms, and exposing the substrate surface to the reactive species. The substrate surface is cooled to a temperature below about 22° C., and a film of the nitrogen and fluorine atoms is deposited on the chilled substrate surface. The substrate surface is annealed to sublimate or remove the film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2B-2C show enlarged schematic views of the gas distribution plate of FIG. 2A.

DETAILED DESCRIPTION

A processing chamber for any number of substrate processing techniques is provided. The chamber is particularly useful for performing a plasma assisted dry etch process that requires both heating and cooling of the substrate surface without breaking vacuum. For example, the processing chamber described herein is envisioned to be best suited for a front-end-of line (FEOL) clean chamber for removing oxides and other contaminants from a substrate surface.

A "substrate surface," as used herein, refers to any substrate surface upon which processing is performed. For example, a substrate surface may include silicon, silicon oxide, doped silicon, germanium, gallium arsenide, glass, sapphire, and any other materials such as metals, metal nitrides, metal alloys, and other conductive materials, depending on the application. A substrate surface may also include dielectric materials such as silicon dioxide, organosilicates, and carbon doped silicon oxides. The substrate itself is not limited to any particular size or shape. In one aspect, the term "substrate" refers to a round wafer having a 200 mm diameter or 300 mm diameter. In another aspect, the term "substrate" refers to any polygonal, squared, rectangular, curved or otherwise non-circular workpiece, such as a glass substrate used in the fabrication of flat panel displays, for example.

Figure 1A:
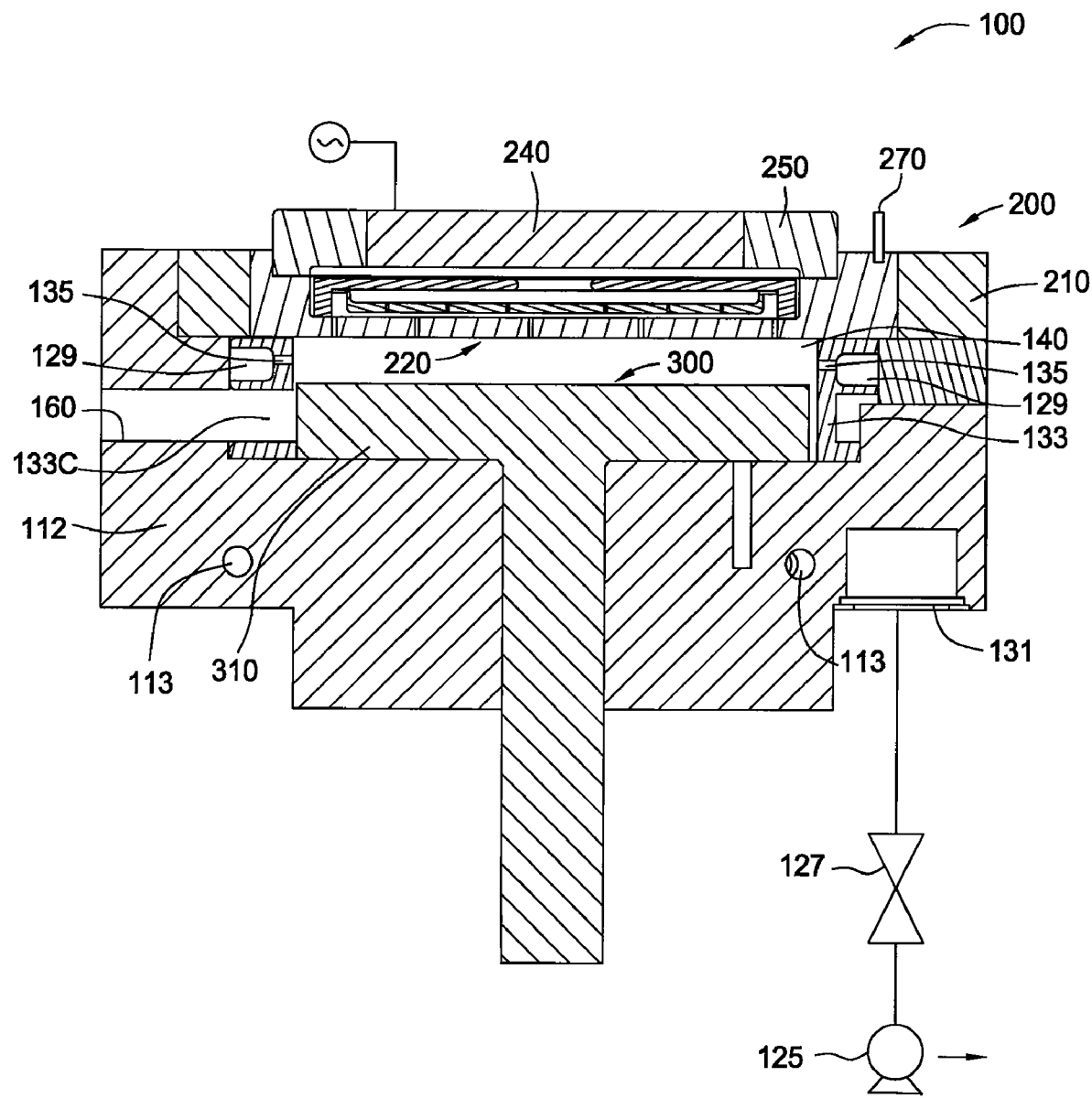
FIG. 1A shows a partial cross sectional view of an illustrative processing chamber 100 for heating, cooling, and etching.

FIG. 1A is a partial cross sectional view showing an illustrative processing chamber 100. In one embodiment, the processing chamber 100 includes a chamber body 112, a lid assembly 200, and a support assembly 300. The lid assembly 200 is disposed at an upper end of the chamber body 112, and the support assembly 300 is at least partially disposed within the chamber body 112. The processing chamber 100 and the associated hardware are preferably formed from one or more process-compatible materials, such as aluminum, anodized aluminum, nickel plated aluminum, nickel plated aluminum 6061-T6, stainless steel, as well as combinations and alloys thereof, for example.

The chamber body 112 includes a slit valve opening 160 formed in a sidewall thereof to provide access to the interior of the processing chamber 100. The slit valve opening 160 is selectively opened and closed to allow access to the interior of the chamber body 112 by a wafer handling robot (not shown). Wafer handling robots are well known to those with skill in the art, and any suitable robot may be used. For example, an exemplary robotic transfer assembly has been described in a commonly assigned U.S. Pat. No. 4,951,601, the complete disclosure of which is incorporated herein by reference. In one embodiment, a wafer can be transported in and out of the processing chamber 100 through the slit valve opening 160 to an adjacent transfer chamber and/or load-lock chamber, or another chamber within a cluster tool. A cluster tool of a type that can be coupled to the processing chamber 100 is described in a commonly assigned U.S. Pat. No. 5,186,718, which is herein incorporated by reference.

In one or more embodiments, the chamber body 112 includes a channel 113 formed therein for flowing a heat transfer fluid therethrough. The heat transfer fluid can be a heating fluid or a coolant and is used to control the temperature of the chamber body 112 during processing and substrate transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 can further include a liner 133 that surrounds the support assembly 300. The liner 133 is preferably removable for servicing and cleaning. The liner 133 can be made of a metal such as aluminum, or a ceramic material. However, the liner 133 can be any process compatible material. The liner 133 can be bead blasted to increase the adhesion of any material deposited thereon, thereby preventing flaking of material which results in contamination of the processing chamber 100. In one or more embodiments, the liner 133 includes one or more apertures 135 and a pumping channel 129 formed therein that is in fluid communication with a vacuum system. The apertures 135 provide a flow path for gases into the pumping channel 129, which provides an egress for the gases within the processing chamber 100.

The vacuum system can include a vacuum pump 125 and a throttle valve 127 to regulate flow of gases through the processing chamber 100. The vacuum pump 125 is coupled to a vacuum port 131 disposed on the chamber body 112 and therefore, in fluid communication with the pumping channel 129 formed within the liner 133. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

Figure 1B:
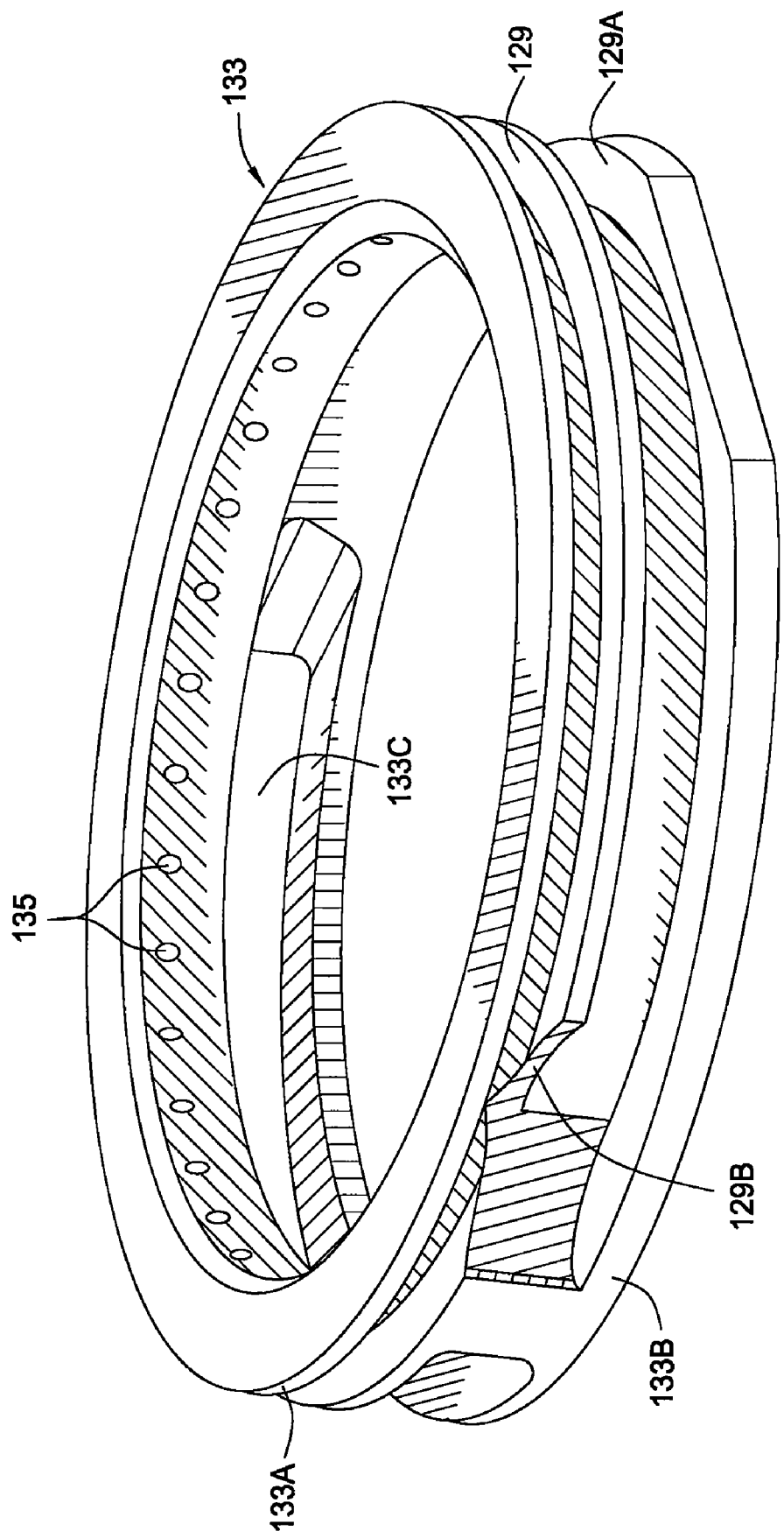
FIG. 1B shows an enlarged schematic view of an illustrative liner disposed within the processing chamber of FIG. 1A.

Considering the liner 133 in greater detail, FIG. 1B shows an enlarged schematic view of one embodiment of the liner 133. In this embodiment, the liner 133 includes an upper portion 133A and a lower portion 133B. An aperture 133C that aligns with the slit valve opening 160 disposed on a side wall of the chamber body 112 is formed within the liner 133 to allow entry and egress of substrates to/from the chamber body 112. Typically, the pumping channel 129 is formed within the upper portion 133A. The upper portion 133A also includes the one or more apertures 135 formed therethrough to provide passageways or flow paths for gases into the pumping channel 129.

Referring to FIGS. 1A-1B, the apertures 135 allow the pumping channel 129 to be in fluid communication with a processing zone 140 within the chamber body 112. The processing zone 140 is defined by a lower surface of the lid assembly 200 and an upper surface of the support assembly 300, and is surrounded by the liner 133. The apertures 135 may be uniformly sized and evenly spaced about the liner 133. However, any number, position, size or shape of apertures may be used, and each of those design parameters can vary depending on the desired flow pattern of gas across the substrate receiving surface as is discussed in more detail below. In addition, the size, number and position of the apertures 135 are configured to achieve uniform flow of gases exiting the processing chamber 100. Further, the aperture size and location may be configured to provide rapid or high capacity pumping to facilitate a rapid exhaust of gas from the chamber 100. For example, the number and size of apertures 135 in close proximity to the vacuum port 131 may be smaller than the size of apertures 135 positioned farther away from the vacuum port 131.

Still referring to FIGS. 1A-1B, the lower portion 133B of the liner 133 includes a flow path or vacuum channel 129A disposed therein. The vacuum channel 129A is in fluid communication with the vacuum system described above. The vacuum channel 129A is also in fluid communication with the pumping channel 129 via a recess or port 129B formed in an outer diameter of the liner 133. Generally, two gas ports 129B (only one shown in this view) are formed in an outer diameter of the liner 133 between the upper portion 133A and the lower portion 133B. The gas ports 129B provide a flow path between the pumping channel 129 and the vacuum channel 129A. The size and location of each port 129B is a matter of design, and are determined by the stoichiometry of a desired film, the geometry of the device being formed, the volume capacity of the processing chamber 100 as well as the capabilities of the vacuum system coupled thereto. Typically, the ports 129B are arranged opposite one another or 180 degrees apart about the outer diameter of the liner 133.

In operation, one or more gases exiting the processing chamber 100 flow through the apertures 135 formed through the upper portion 133A of the liner 133 into the pumping channel 129. The gas then flows within the pumping channel 129 and through the ports 129B into the vacuum channel 129A. The gas exits the vacuum channel 129A through the vacuum port 131 into the vacuum pump 125.

Figure 2A:
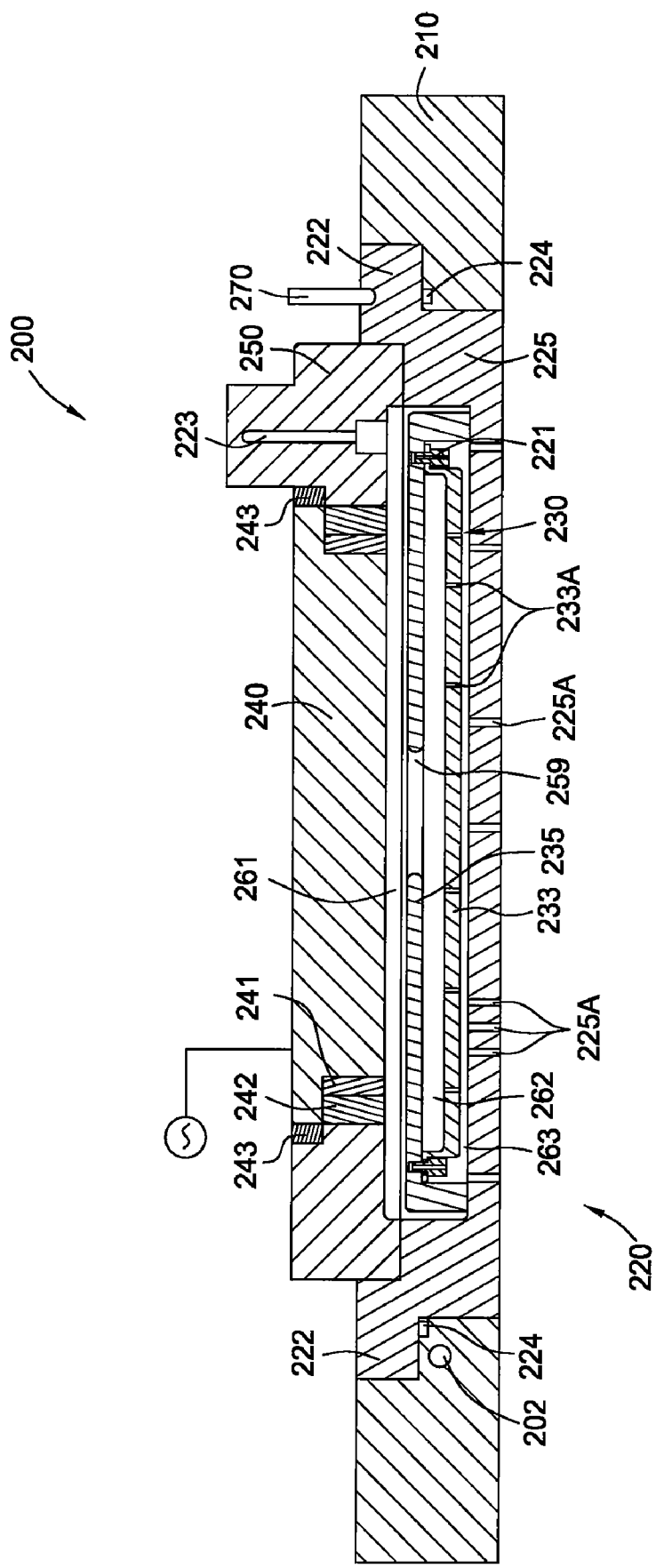
FIG. 2A shows an enlarged cross sectional view of an illustrative lid assembly that can be disposed at an upper end of the chamber body shown in FIG. 1A.

Considering the lid assembly 200 in more detail, FIG. 2A shows an enlarged cross sectional view of an illustrative lid assembly 200 that can be disposed at an upper end of the chamber body 112 shown in FIG. 1A. Referring to FIGS. 1A and 2A, the lid assembly 200 includes a number of components stacked on top of one another, as shown in FIG. 1A. In one or more embodiments, the lid assembly 200 includes a lid rim 210, gas delivery assembly 220, and a top plate 250. The gas delivery assembly 220 is coupled to an upper surface of the lid rim 210 and is arranged to make minimum thermal contact therewith. The components of the lid assembly 200 are preferably constructed of a material having a high thermal conductivity and low thermal resistance, such as an aluminum alloy with a highly finished surface for example. Preferably, the thermal resistance of the components is less than about $5 \times 10^{-4}$ m$^2$K/W. The lid rim 210 is designed to hold the weight of the components making up the lid assembly 200 and is coupled to an upper surface of the chamber body 112 via a hinge assembly (not shown in this view) to provide access to the internal chamber components, such as the support assembly 300 for example.

Referring to FIGS. 2B-2C, the gas delivery assembly 220 can include a distribution plate or showerhead 225. FIG. 2B shows an enlarged schematic view of one embodiment of an illustrative gas distribution plate 225 and FIG. 2C shows a partial cross sectional view. In one or more embodiments, the distribution plate 225 is substantially disc-shaped and includes a plurality of apertures 225A or passageways to distribute the flow of gases therethrough. The apertures 225A of the distribution plate 225 prevent the gases flowing through the lid assembly 200 from impinging directly on the substrate surface below by slowing and re-directing the velocity profile of the flowing gases. The apertures 225A of the distribution plate 225 also evenly distribute the flow of the gas exiting the lid assembly 200, thereby providing an even distribution of the gas across the surface of the substrate.

Referring to FIGS. 2A-2C, the distribution plate 225 further includes an annular mounting flange 222 formed at a perimeter thereof, which is sized to rest on the lid rim 210. Accordingly, the distribution plate 225 makes minimal contact with the lid assembly 200. Preferably, an o-ring type seal 224, such as an elastomeric o-ring, is at least partially disposed within the annular mounting flange 222 to ensure a fluid-tight contact with the lid rim 210.

The gas delivery assembly 220 can further include a blocker assembly 230 disposed adjacent the distribution plate 225. The blocker assembly 230 provides an even distribution of gas to the backside of the distribution plate 225. Preferably, the blocker assembly 230 is made of an aluminum alloy and is removably coupled to the distribution plate 225 to ensure good thermal contact. For example, the blocker assembly 230 can be coupled to the distribution plate 225 using a bolt 221 or similar fastener. Preferably, the blocker assembly 230 makes no thermal contact with the lid rim 210 as shown in FIG. 2A.

In one or more embodiments, the blocker assembly 230 includes a first blocker plate 233 mounted to a second blocker plate 235. The second blocker plate 235 includes a passage 259 formed therethrough. Preferably, the passage 259 is centrally located through the second blocker plate 235 such that the passage 259 is in fluid communication with a first cavity or volume 261 defined by a lower surface of the top plate 250 and an upper surface of the second blocker plate 235. The passage 259 is also in fluid communication with a second cavity or volume 262 defined by a lower surface of the second blocker plate 235 and an upper surface of the first blocker plate 233. The passage 259 is also in fluid communication with a third cavity or volume 263 defined by a lower surface of the first blocker plate 233 and an upper surface of the distribution plate 225. The passage 259 is coupled to a gas inlet 223. The gas inlet 223 is coupled to the top plate 250 at a first end thereof. Although not shown, the gas inlet 223 is coupled at a second end thereof to one or more upstream gas sources and/or other gas delivery components, such as gas mixers.

The first blocker plate 233 includes a plurality of passageways 233A formed therein that are adapted to disperse the gases flowing from the passage 259 to the gas distribution plate 225. Although the passageways 233A are shown as being circular or rounded, the passageways 233A can be square, rectangular, or any other shape. The passageways 233A can be sized and positioned about the blocker plate 233 to provide a controlled and even flow distribution across the surface of the substrate. As described above, the first blocker plate 233 can easily be removed from the second blocker plate 235 and from the distribution plate 225 to facilitate cleaning or replacement of those components.

In use, one or more process gases are introduced into the gas delivery assembly 220 via the gas inlet 223. The process gas flows into the first volume 261 and through the passage 259 of the second blocker plate 235 into the second volume 262. The process gas is then distributed through the holes 233A of the first blocker plate 233 into the third volume 263 and further distributed through the holes 225A of the distribution plate 225 until the gas meets the exposed surfaces of the substrate disposed within the chamber body 112.

A gas supply panel (not shown) is typically used to provide the one or more gases to the processing chamber 100. The particular gas or gases that are used depend upon the process or processes to be performed within the chamber 100. Illustrative gases can include, but are not limited to one or more precursors, reductants, catalysts, carriers, purge, cleaning, or any mixture or combination thereof. Typically, the one or more gases introduced to the processing chamber 100 flow through the inlet 223 into the lid assembly 200 and then into the chamber body 112 through the gas delivery assembly 220. An electronically operated valve and/or flow control mechanism (not shown) may be used to control the flow of gas from the gas supply into the processing chamber 100. Depending on the process, any number of gases can be delivered to the processing chamber 100, and can be mixed either in the processing chamber 100 or before the gases are delivered to the processing chamber 100, such as within a gas mixture (not shown), for example.

Still referring to FIGS. 1A and 2A, the lid assembly 200 can further include an electrode 240 to generate a plasma of reactive species within the lid assembly 200. In one embodiment, the electrode 240 is supported on the top plate 250 and is electrically isolated therefrom. For example, an isolator filler ring 241 can be disposed about a lower portion of the electrode 240 separating the electrode 240 from the top plate 250 as shown in FIG. 2A. An annular isolator 242 can also be disposed about an outer surface of the isolator filler ring 241. An annular insulator 243 can then be disposed about an upper portion of the electrode 240 so that the electrode 240 is electrically isolated from the top plate 250 and all the other components of the lid assembly 200. Each of these rings 241, 242, 243 can be made from aluminum oxide or any other insulative, process compatible material.

In one or more embodiments, the electrode 240 is coupled to a power source (not shown) while the gas delivery assembly 220 is connected to ground (e.g., the gas delivery assembly 220 serves as an electrode). Accordingly, a plasma of one or more process gases can be generated in the volumes 261, 262 and/or 263 between the electrode 240 ("first electrode") and the gas delivery assembly 220 ("second electrode"). For example, the plasma can be struck and contained between the electrode 240 and the blocker assembly 230. Alternatively, the plasma can be struck and contained between the electrode 240 and the distribution plate 225, in the absence of the blocker assembly 230. In either embodiment, the plasma is well confined or contained within the lid assembly 200. Accordingly, the plasma is a "remote plasma" since no active plasma is in direct contact with the substrate disposed within the chamber body 112. As a result, plasma damage to the substrate is avoided because the plasma is sufficiently separated from the substrate surface.

Any power source capable of activating the gases into reactive species and maintaining the plasma of reactive species may be used. For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 100. Exemplary remote plasma generators are available from vendors such as MKS Instruments, Inc. and Advanced Energy Industries, Inc. Preferably, an RF power supply is coupled to the electrode 240.

Referring to FIG. 2A, the gas delivery assembly 220 can be heated depending on the process gases and operations to be performed within the processing chamber 100. In one embodiment, a heating element 270, such as a resistive heater for example, can be coupled to the distribution plate 225. In one embodiment, the heating element 270 is a tubular member and is pressed into an upper surface of the distribution plate 225 as shown in more detail in FIGS. 2B-2C.

Referring to FIGS. 2B-2C, the upper surface of the distribution plate 225 includes a groove or recessed channel having a width slightly smaller than the outer diameter of the heating element 270, such that the heating element 270 is held within the groove using an interference fit. The heating element 270 regulates the temperature of the gas delivery assembly 220 since the components of the delivery assembly 220, including the distribution plate 225 and the blocker assembly 230, are each conductively coupled to one another. Regulation of the temperature may be facilitated by a thermocouple 272 coupled to the distribution plate 225. The thermocouple 272 may be used in a feedback loop to control electric current applied to the heating element 270 from a power supply, such that the gas delivery assembly 220 temperature can be maintained or controlled at a desired temperature or within a desired temperature range. Control of the gas delivery assembly 220 temperature is facilitated because as described above, the gas delivery assembly 220 makes minimal thermal contact with the other components of the lid assembly 200, and as such, thermal conductivity is limited.

In one or more embodiments, the lid assembly 200 can include one or more fluid channel 202 formed therein for flowing a heat transfer medium to provide temperature control of the gas delivery assembly 220. In one embodiment, the fluid channel 202 can be formed within the lid rim 210, as shown in FIG. 2A. Alternatively, the fluid channel 202 can be formed within any component of the lid assembly 200 to provide an uniform heat transfer to the gas delivery assembly 220. The fluid channel 202 can contain either a heating or cooling medium to control temperature of the gas delivery assembly 220, depending on the process requirements within the chamber 100. Any heat transfer medium may be used, such as nitrogen, water, ethylene glycol, or mixtures thereof, for example.

In one or more embodiments, the gas delivery assembly 220 can be heated using one or more heat lamps (not shown). Typically, the heat lamps are arranged about an upper surface of the distribution plate 225 to heat the distribution plate 225 by radiation.

Figure 3A:
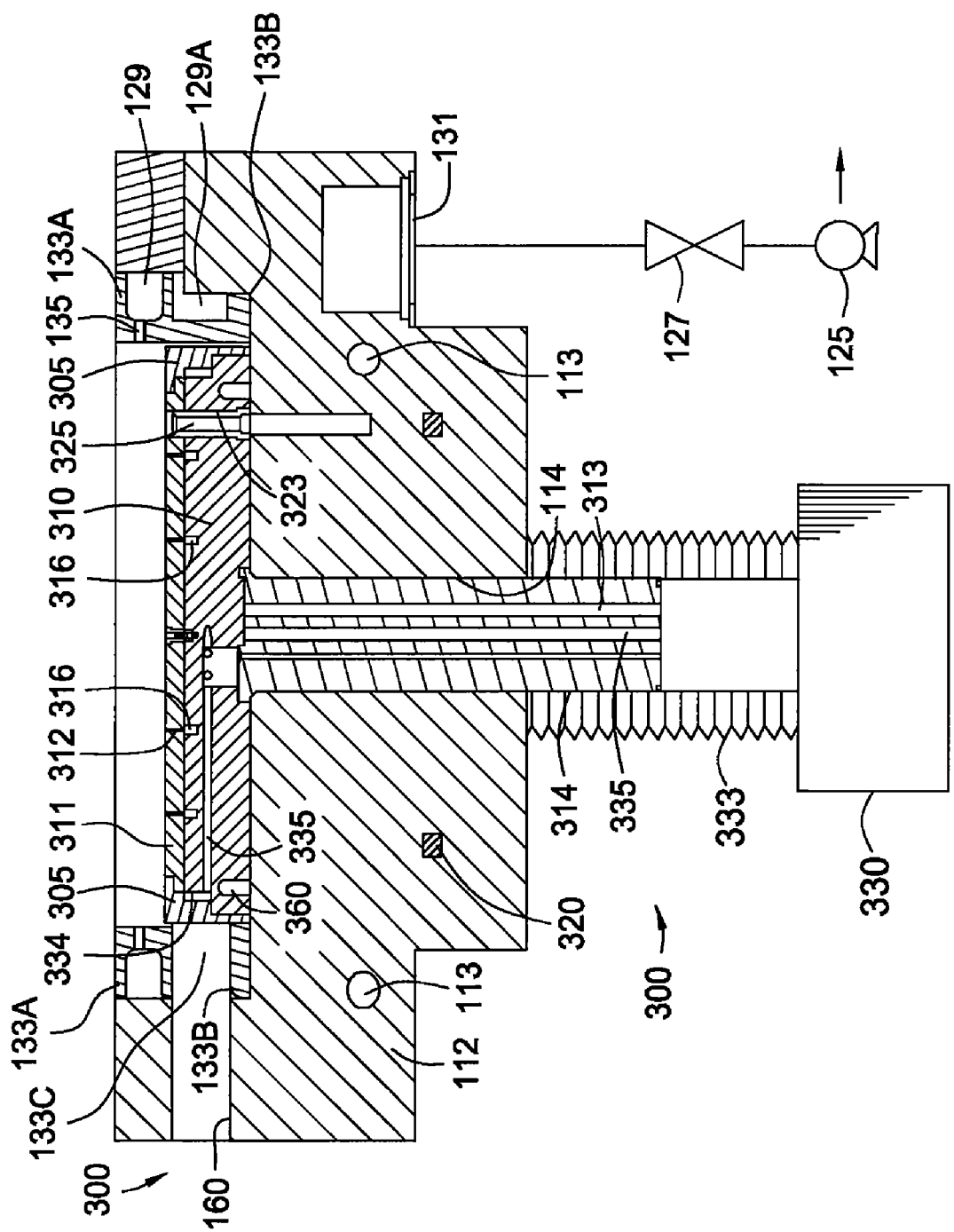
FIG. 3A shows a partial cross sectional view of an illustrative support assembly, which is at least partially disposed within the chamber body 112 of FIG. 1A.

FIG. 3A shows a partial cross sectional view of an illustrative support assembly 300. The support assembly 300 can be at least partially disposed within the chamber body 112. The support assembly 300 can include a support member 310 to support a substrate (not shown in this view) for processing within the chamber body 112. The support member 310 can be coupled to a lift mechanism 330 through a shaft 314 which extends through a centrally-located opening 114 formed in a bottom surface of the chamber body 112. The lift mechanism 330 can be flexibly sealed to the chamber body 112 by a bellows 333 that prevents vacuum leakage from around the shaft 314. The lift mechanism 330 allows the support member 310 to be moved vertically within the chamber body 112 between a process position and a lower, transfer position. The transfer position is slightly below the opening of the slit valve 160 formed in a sidewall of the chamber body 112.

Figure 3B:
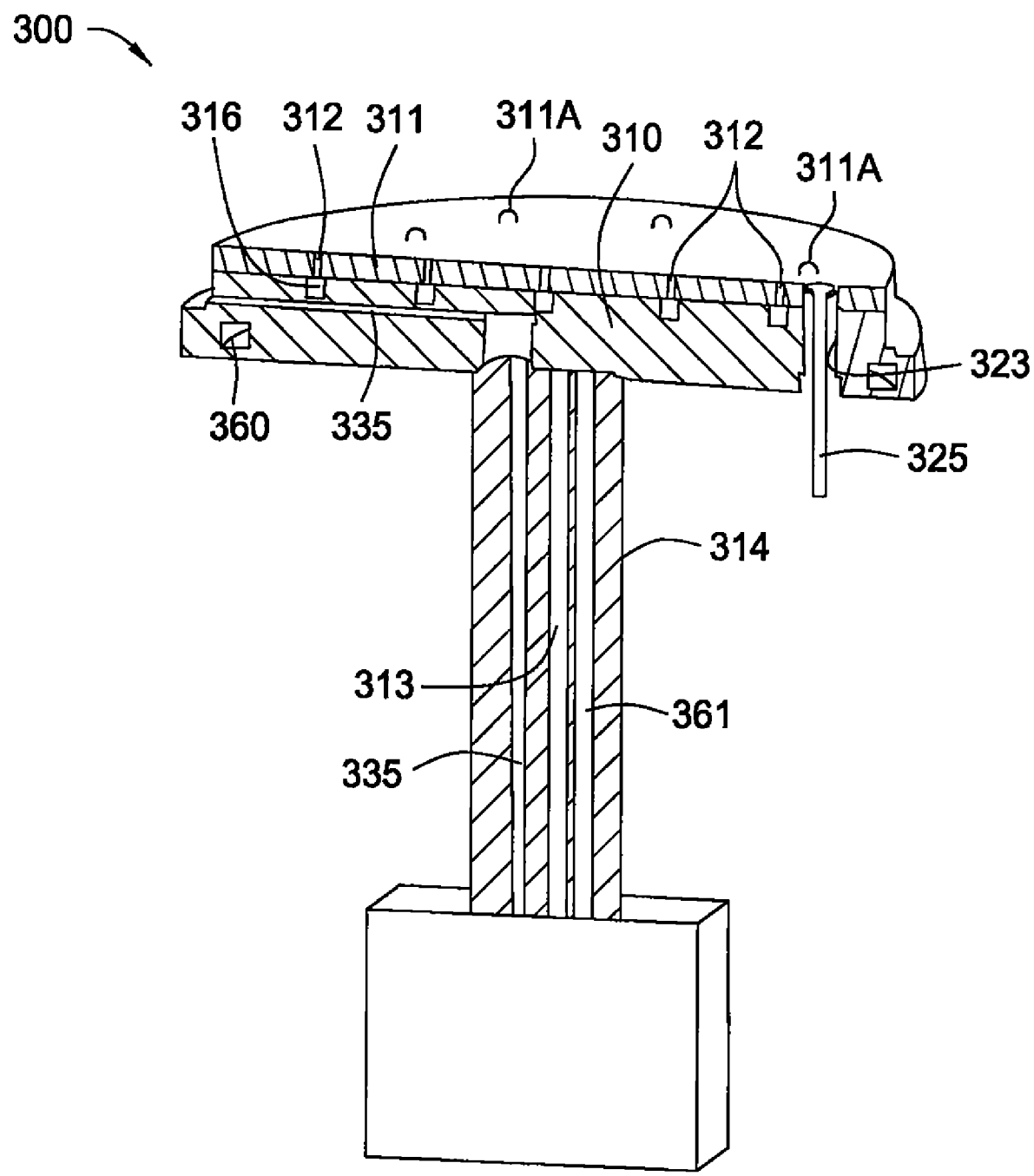
FIG. 3B shows an enlarged partial cross sectional view of the illustrative support member 300 of FIG. 3A.

FIG. 3B shows an enlarged partial cross sectional of the support assembly 300 shown in FIG. 3A. In one or more embodiments, the support member 310 has a flat, circular surface or a substantially flat, circular surface for supporting a substrate to be processed thereon. The support member 310 is preferably constructed of aluminum. The support member 310 can include a removable top plate 311 made of some other material, such as silicon or ceramic material, for example, to reduce backside contamination of the substrate.

In one or more embodiments, the support member 310 or the top plate 311 can include a plurality of extensions or dimples 311A arranged on the upper surface thereof. In FIG. 3B, the dimples 311A are shown on the upper surface of the top plate 311. It can be envisioned that the dimples 311A can be arranged on the upper surface of the support member 310 if a top plate 311 is not desired. The dimples 311A provide minimum contact between the lower surface of the substrate and the support surface of the support assembly 300 (e.g. either the support member 310 or the top plate 311).

In one or more embodiments, the substrate (not shown) may be secured to the support assembly 300 using a vacuum chuck. The top plate 311 can include a plurality of holes 312 in fluid communication with one or more grooves 316 formed in the support member 310. The grooves 316 are in fluid communication with a vacuum pump (not shown) via a vacuum conduit 313 disposed within the shaft 314 and the support member 310. Under certain conditions, the vacuum conduit 313 can be used to supply a purge gas to the surface of the support member 310 to prevent deposition when a substrate is not disposed on the support member 310. The vacuum conduit 313 can also pass a purge gas during processing to prevent a reactive gas or byproduct from contacting the backside of the substrate.

In one or more embodiments, the substrate (not shown) may be secured to the support member 310 using an electrostatic chuck. In one or more embodiments, the substrate can be held in place on the support member 310 by a mechanical clamp (not shown), such as a conventional clamp ring.

Preferably, the substrate is secured using an electrostatic chuck. An electrostatic chuck typically includes at least a dielectric material that surrounds an electrode (not shown), which may be located on an upper surface of the support member 310 or formed as an integral part of the support member 310. The dielectric portion of the chuck electrically insulates the chuck electrode from the substrate and from the remainder of the support assembly 300.

In one or more embodiments, the perimeter of the chuck dielectric can be is slightly smaller than the perimeter of the substrate. In other words, the substrate slightly overhangs the perimeter of the chuck dielectric so that the chuck dielectric will remain completely covered by the substrate even if the substrate is misaligned off center when positioned on the chuck. Assuring that the substrate completely covers the chuck dielectric ensures that the substrate shields the chuck from exposure to potentially corrosive or damaging substances within the chamber body 112.

The voltage for operating the electrostatic chuck can be supplied by a separate "chuck" power supply (not shown). One output terminal of the chucking power supply is connected to the chuck electrode. The other output terminal typically is connected to electrical ground, but alternatively may be connected to a metal body portion of the support assembly 300. In operation, the substrate is placed in contact with the dielectric portion, and a direct current voltage is placed on the electrode to create the electrostatic attractive force or bias to adhere the substrate on the upper surface of the support member 310.

Still referring to FIGS. 3A-3B, the support member 310 can include one or more bores 323 formed therethrough to accommodate a lift pin 325. Each lift pin 325 is typically constructed of ceramic or ceramic-containing materials, and are used for substrate-handling and transport. Each lift pin 325 is slideably mounted within the bore 323. In one aspect, the bore 323 is lined with a ceramic sleeve to help freely slide the lift pin 325. The lift pin 325 is moveable within its respective bore 323 by engaging an annular lift ring 320 disposed within the chamber body 112. The lift ring 320 is movable such that the upper surface of the lift-pin 325 can be located above the substrate support surface of the support member 310 when the lift ring 320 is in an upper position. Conversely, the upper surface of the lift-pins 325 is located below the substrate support surface of the support member 310 when the lift ring 320 is in a lower position. Thus, part of each lift-pin 325 passes through its respective bore 323 in the support member 310 when the lift ring 320 moves from either the lower position to the upper position.

When activated, the lift pins 325 push against a lower surface of the substrate, lifting the substrate off the support member 310. Conversely, the lift pins 325 may be de-activated to lower the substrate, thereby resting the substrate on the support member 310. The lift pins 325 can include enlarged upper ends or conical heads to prevent the pins 325 from falling out from the support member 310. Other pin designs can also be utilized and are well known to those skilled in the art.

In one embodiment, one or more of the lift pins 325 include a coating or an attachment disposed thereon that is made of a non-skid or highly frictional material to prevent the substrate from sliding when supported thereon. A preferred material is a high temperature, polymeric material that does not scratch or otherwise damage the backside of the substrate which would create contaminants within the processing chamber 100. Preferably, the coating or attachment is KALREZ® coating available from DuPont Co.

To drive the lift ring 320, an actuator, such as a conventional pneumatic cylinder or a stepper motor (not shown), is generally used. The stepper motor or cylinder drives the lift ring 320 in the up or down positions, which in turn drives the lift-pins 325 that raise or lower the substrate. In a specific embodiment, a substrate (not shown) is supported on the support member 310 by three lift-pins 325 (not shown in this view) dispersed approximately 120 degrees apart and projecting from the lift ring 320.

Referring again to FIG. 3A, the support assembly 300 can include an edge ring 305 disposed about the support member 310. The edge ring 305 can be made of a variety of materials such as ceramic, quartz, aluminum, and steel, among others. In one or more embodiments, the edge ring 305 is an annular member that is adapted to cover an outer perimeter of the support member 310 and protect the support member 310 from deposition. The edge ring 305 can be positioned on or adjacent the support member 310 to form an annular purge gas channel 334 between the outer diameter of support member 310 and the inner diameter of the edge ring 305. The annular purge gas channel 334 can be in fluid communication with a purge gas conduit 335 formed through the support member 310 and the shaft 314. Preferably, the purge gas conduit 335 is in fluid communication with a purge gas supply (not shown) to provide a purge gas to the purge gas channel 334. Any suitable purge gas such as nitrogen, argon, or helium, may be used alone or in combination. In operation, the purge gas flows through the conduit 335, into the purge gas channel 334, and about an edge of the substrate disposed on the support member 310. Accordingly, the purge gas working in cooperation with the edge ring 305 prevents deposition at the edge and/or backside of the substrate.

Referring again to FIGS. 3A-3B, the temperature of the support assembly 300 is controlled by a fluid circulated through a fluid channel 360 embedded in the body of the support member 310. In one or more embodiments, the fluid channel 360 is in fluid communication with a heat transfer conduit 361 disposed through the shaft 314 of the support assembly 300. Preferably, the fluid channel 360 is positioned about the support member 310 to provide a uniform heat transfer to the substrate receiving surface of the support member 310. The fluid channel 360 and heat transfer conduit 361 can flow heat transfer fluids to either heat or cool the support member 310. Any suitable heat transfer fluid may be used, such as water, nitrogen, ethylene glycol, or mixtures thereof. The support assembly 300 can further include an embedded thermocouple (not shown) for monitoring the temperature of the support surface of the support member 310. For example, a signal from the thermocouple may be used in a feedback loop to control the temperature or flowrate of the fluid circulated through the fluid channel 360.

Referring back to FIG. 3A, the support member 310 can be moved vertically within the chamber body 112 so that a distance between support member 310 and the lid assembly 200 can be controlled. A sensor (not shown) can provide information concerning the position of support member 310 within chamber 100. An example of a lifting mechanism for the support member 310 is described in detail in U.S. Pat. No. 5,951,776, which is hereby incorporated by reference in its entirety.

In operation, the support member 310 can be elevated to a close proximity of the lid assembly 200 to control the temperature of the substrate being processed. As such, the substrate can be heated via radiation emitted from the distribution plate 225 that is controlled by the heating element 270. Alternatively, the substrate can be lifted off the support member 310 to close proximity of the heated lid assembly 200 using the lift pins 325 activated by the lift ring 320.

After extended periods of use or at designated times for scheduled maintenance, certain components of the processing chamber 100 including those described above can be regularly inspected, replaced, or cleaned. These components are typically parts that are collectively known as the "process kit." Illustrative components of the process kit can include, but are not limited to the showerhead 225, the top plate 311, the edge ring 305, the liner 133, and the lift pins 325, for example. Any one or more of these components are typically removed from the chamber 100 and cleaned or replaced at regular intervals or according to an as-needed basis.

Figure 4A:
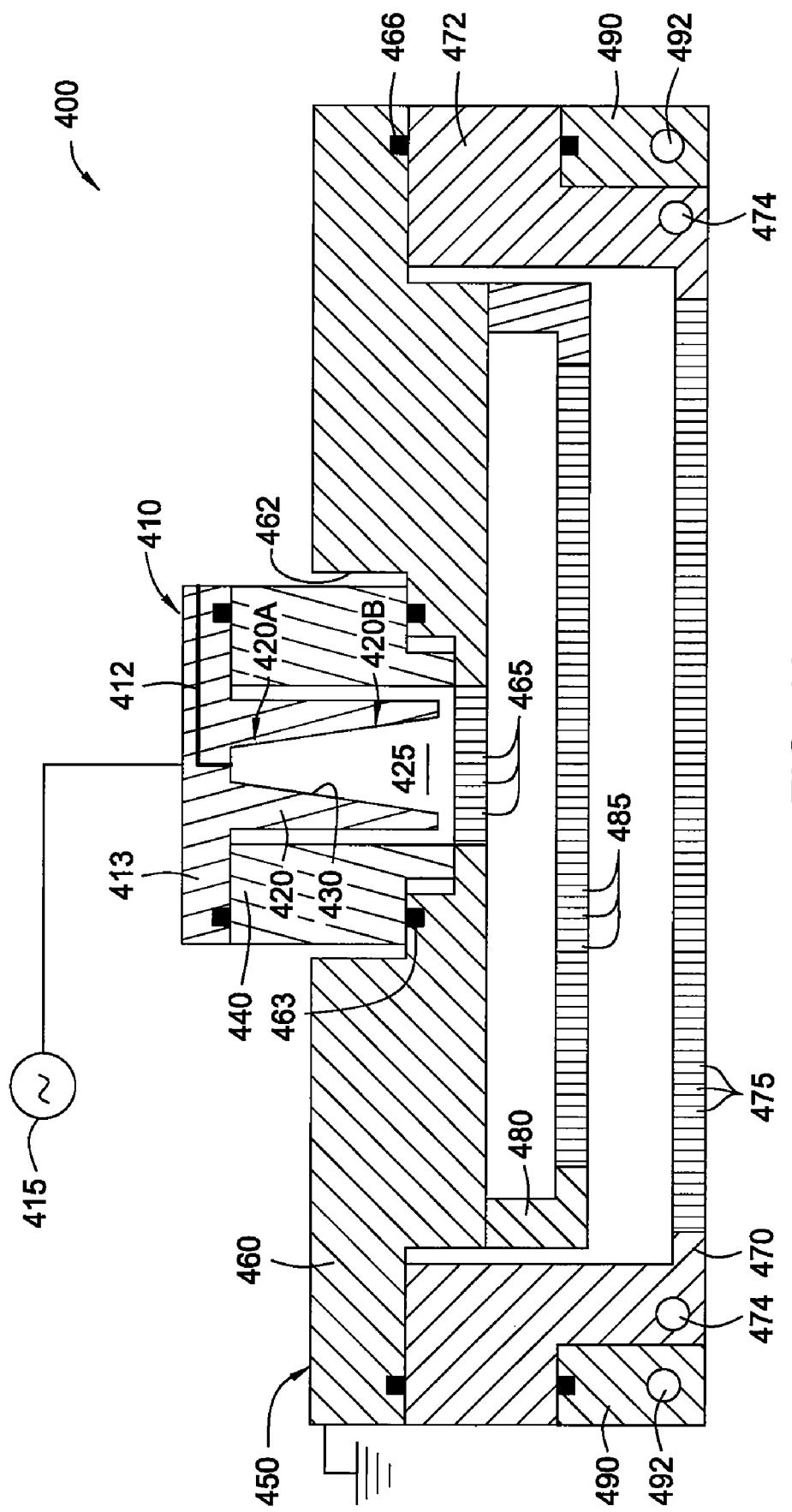
FIG. 4A shows a schematic cross sectional view of another illustrative lid assembly 400.

FIG. 4A shows a partial cross sectional view of another illustrative lid assembly 400. The lid assembly 400 includes at least two stacked components configured to form a plasma volume or cavity therebetween. In one or more embodiments, the lid assembly 400 includes a first electrode 410 ("upper electrode") disposed vertically above a second electrode 450 ("lower electrode") confining a plasma volume or cavity 425 therebetween. The first electrode 410 is connected to a power source 415, such as an RF power supply, and the second electrode 450 is connected to ground, forming a capacitance between the two electrodes 410, 450.

In one or more embodiments, the lid assembly 400 includes one or more gas inlets 412 (only one is shown) that are at least partially formed within an upper section 413 of the first electrode 410. The one or more process gases enter the lid assembly 400 via the one or more gas inlets 412. The one or more gas inlets 412 are in fluid communication with the plasma cavity 425 at a first end thereof and coupled to one or more upstream gas sources and/or other gas delivery components, such as gas mixers, at a second end thereof. The first end of the one or more gas inlets 412 can open into the plasma cavity 425 at the upper most point of the inner diameter 430 of the expanding section 420 as shown in FIG. 4A. Similarly, the first end of the one or more gas inlets 412 can open into the plasma cavity 425 at any height interval along the inner diameter 430 of the expanding section 420. Although not shown, two gas inlets 412 can be disposed at opposite sides of the expanding section 420 to create a swirling flow pattern or "vortex" flow into the expanding section 420 which helps mix the gases within the plasma cavity 425. A more detailed description of such a flow pattern and gas inlet arrangements is provided by commonly assigned U.S. Pat. No. 6,916,398, which is incorporated herein by reference in its entirety.

In one or more embodiments, the first electrode 410 has an expanding section 420 that houses the plasma cavity 425. As shown in FIG. 4A, the expanding section 420 is in fluid communication with the gas inlet 412 as described above. In one or more embodiments, the expanding section 420 is an annular member that has an inner surface or diameter 430 that gradually increases from an upper portion 420A thereof to a lower portion 420B thereof. As such, the distance between the first electrode 410 and the second electrode 450 is variable. That varying distance helps control the formation and stability of the plasma generated within the plasma cavity 425.

Figure 4B:
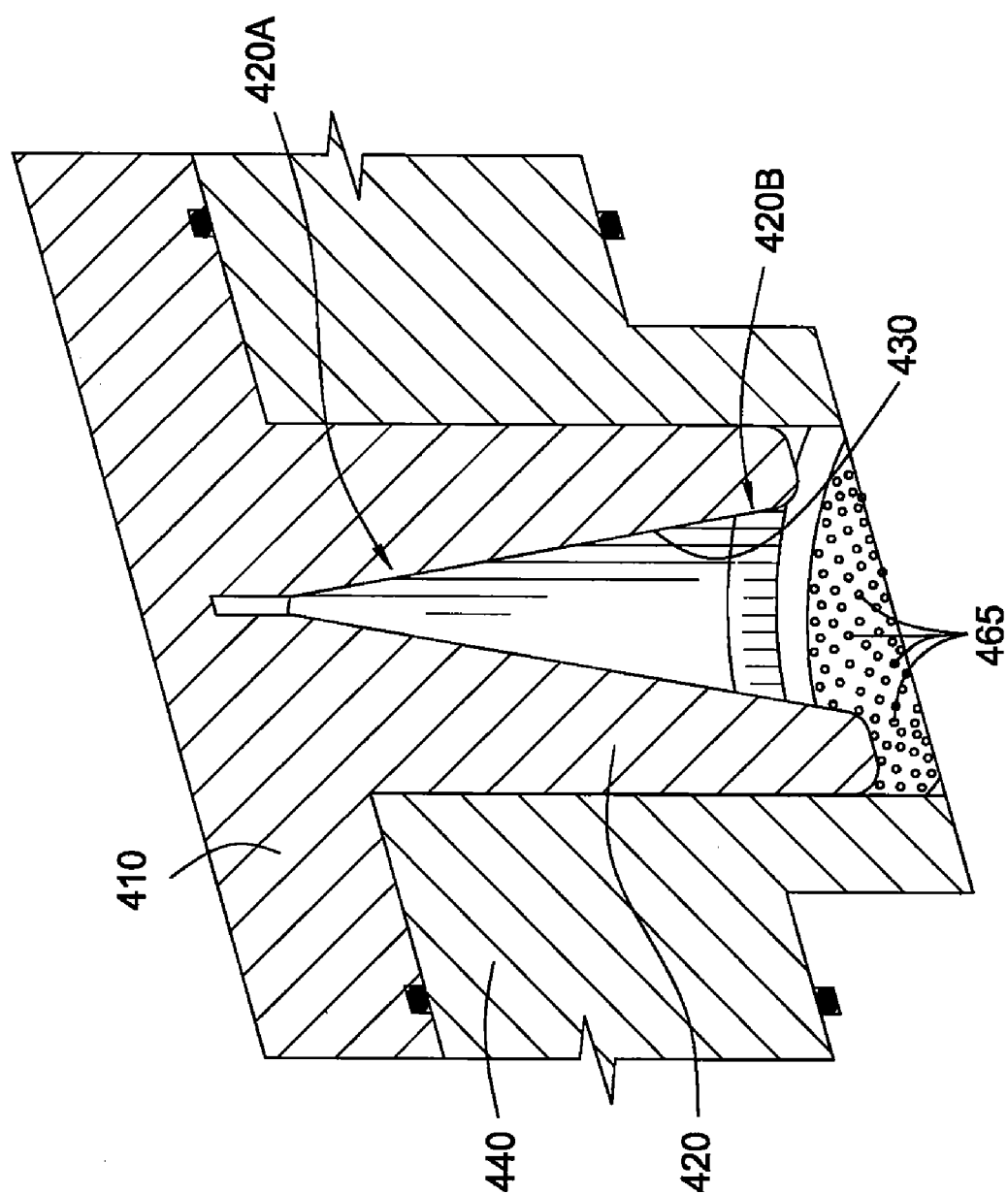
FIG. 4B shows an enlarged schematic, partial cross sectional view of the upper electrode of FIG. 4A.

In one or more embodiments, the expanding section 420 resembles a cone or "funnel," as is shown in FIGS. 4A-4B. FIG. 4B shows an enlarged schematic, partial cross sectional view of the upper electrode of FIG. 4A. In one or more embodiments, the inner surface 430 of the expanding section 420 gradually slopes from the upper portion 420A to the lower portion 420B of the expanding section 420. The slope or angle of the inner diameter 430 can vary depending on process requirements and/or process limitations. The length or height of the expanding section 420 can also vary depending on specific process requirements and/or limitations. In one or more embodiments, the slope of the inner diameter 430, or the height of the expanding section 420, or both can vary depending on the volume of plasma needed for processing. For example, the slope of the inner diameter 430 can be at least 1:1, or at least 1.5:1 or at least 2:1 or at least 3:1 or at least 4:1 or at least 5:1 or at least 10:1. In one or more embodiments, the slope of the inner diameter 430 can range from a low of 2:1 to a high of 20:1.

In one or more embodiments, the expanding section 420 can be curved or arced although not shown in the figures. For example, the inner surface 430 of the expanding section 420 can be curved or arced to be either convexed or concaved. In one or more embodiments, the inner surface 430 of the expanding section 420 can have a plurality of sections that are each sloped, tapered, convexed, or concaved.

As mentioned above, the expanding section 420 of the first electrode 410 varies the vertical distance between the first electrode 410 and the second electrode 450 because of the gradually increasing inner surface 430 of the first electrode 410. That variable distance is directly related to the power level within the plasma cavity 425. Not wishing to be bound by theory, the variation in distance between the two electrodes 410, 450 allows the plasma to find the necessary power level to sustain itself within some portion of the plasma cavity 425 if not throughout the entire plasma cavity 425. The plasma within the plasma cavity 425 is therefore less dependent on pressure, allowing the plasma to be generated and sustained within a wider operating window. As such, a more repeatable and reliable plasma can be formed within the lid assembly 400.

The first electrode 410 can be constructed from any process compatible materials, such as aluminum, anodized aluminum, nickel plated aluminum, nickel plated aluminum 6061-T6, stainless steel as well as combinations and alloys thereof, for example. In one or more embodiments, the entire first electrode 410 or portions thereof are nickel coated to reduce unwanted particle formation. Preferably, at least the inner surface 430 of the expanding section 420 is nickel plated.

The second electrode 450 can include one or more stacked plates. When two or more plates are desired, the plates should be in electrical communication with one another. Each of the plates should include a plurality of apertures or gas passages to allow the one or more gases from the plasma cavity 425 to flow through.

Referring to FIG. 4B, the lid assembly 400 can further include an isolator ring 440 to electrically isolate the first electrode 410 from the second electrode 450. The isolator ring 440 can be made from aluminum oxide or any other insulative, process compatible material. Preferably, the isolator ring 440 surrounds or substantially surrounds at least the expanding section 420 as shown in FIG. 4B.

Referring again to the specific embodiment shown in FIG. 4A, the second electrode 450 includes a top plate 460, distribution plate 470 and blocker plate 480. The top plate 460, distribution plate 470 and blocker plate 480 are stacked and disposed on a lid rim 490 which is connected to the chamber body 112 as shown in FIG. 4B. As is known in the art, a hinge assembly (not shown) can be used to couple the lid rim 490 to the chamber body 112. The lid rim 490 can include an embedded channel or passage 492 for housing a heat transfer medium. The heat transfer medium can be used for heating, cooling, or both, depending on the process requirements. Illustrative heat transfer mediums are listed above.

In one or more embodiments, the top plate 460 includes a plurality of gas passages or apertures 465 formed beneath the plasma cavity 425 to allow gas from the plasma cavity 425 to flow therethrough. In one or more embodiments, the top plate 460 can include a recessed portion 462 that is adapted to house at least a portion of the first electrode 410. In one or more embodiments, the apertures 465 are through the cross section of the top plate 460 beneath the recessed portion 462. The recessed portion 462 of the top plate 460 can be stair stepped as shown in FIG. 4A to provide a better sealed fit therebetween. Furthermore, the outer diameter of the top plate 460 can be designed to mount or rest on an outer diameter of the distribution plate 470 as shown in FIG. 4A. An o-ring type seal, such as an elastomeric o-ring 463, can be at least partially disposed within the recessed portion 462 of the top plate 460 to ensure a fluid-tight contact with the first electrode 410. Likewise, an o-ring type seal 466 can be used to provide a fluid-tight contact between the outer perimeters of the top plate 460 and the distribution plate 470.

In one or more embodiments, the distribution plate 470 is identical to the distribution plate 225 shown and described above with reference to FIGS. 2A-2C. Particularly, the distribution plate 470 is substantially disc-shaped and includes a plurality of apertures 475 or passageways to distribute the flow of gases therethrough. The apertures 475 can be sized and positioned about the distribution plate 470 to provide a controlled and even flow distribution to the chamber body 112 where the substrate to be processed is located. Furthermore, the apertures 475 prevent the gas(es) from impinging directly on the substrate surface by slowing and re-directing the velocity profile of the flowing gases, as well as evenly distributing the flow of gas to provide an even distribution of gas across the surface of the substrate.

The distribution plate 470 can also include an annular mounting flange 472 formed at an outer perimeter thereof. The mounting flange 472 can be sized to rest on an upper surface of the lid rim 490. An o-ring type seal, such as an elastomeric o-ring, can be at least partially disposed within the annular mounting flange 472 to ensure a fluid-tight contact with the lid rim 490.

In one or more embodiments, the distribution plate 470 includes one or more embedded channels or passages 474 for housing a heater or heating fluid to provide temperature control of the lid assembly 400. Similar to the lid assembly 200 described above, a resistive heating element can be inserted within the passage 474 to heat the distribution plate 470. A thermocouple can be connected to the distribution plate 470 to regulate the temperature thereof. The thermocouple can be used in a feedback loop to control electric current applied to the heating element, as described above.

Alternatively, a heat transfer medium can be passed through the passage 474. The one or more passages 474 can contain a cooling medium, if needed, to better control temperature of the distribution plate 470 depending on the process requirements within the chamber body 112. As mentioned above, any heat transfer medium may be used, such as nitrogen, water, ethylene glycol, or mixtures thereof, for example.

In one or more embodiments, the lid assembly 400 can be heated using one or more heat lamps (not shown). Typically, the heat lamps are arranged about an upper surface of the distribution plate 470 to heat the components of the lid assembly 400 including the distribution plate 470 by radiation.

The blocker plate 480 is optional and would be disposed between the top plate 460 and the distribution plate 470. Preferably, the blocker plate 480 is removably mounted to a lower surface of the top plate 460. The blocker plate 480 should make good thermal and electrical contact with the top plate 460. In one or more embodiments, the blocker plate 480 can be coupled to the top plate 460 using a bolt or similar fastener. The blocker plate 480 can also be threaded or screwed onto an out diameter of the top plate 460.

The blocker plate 480 includes a plurality of apertures 485 to provide a plurality of gas passages from the top plate 460 to the distribution plate 470. The apertures 485 can be sized and positioned about the blocker plate 480 to provide a controlled and even flow distribution the distribution plate 470.

Figure 4C:
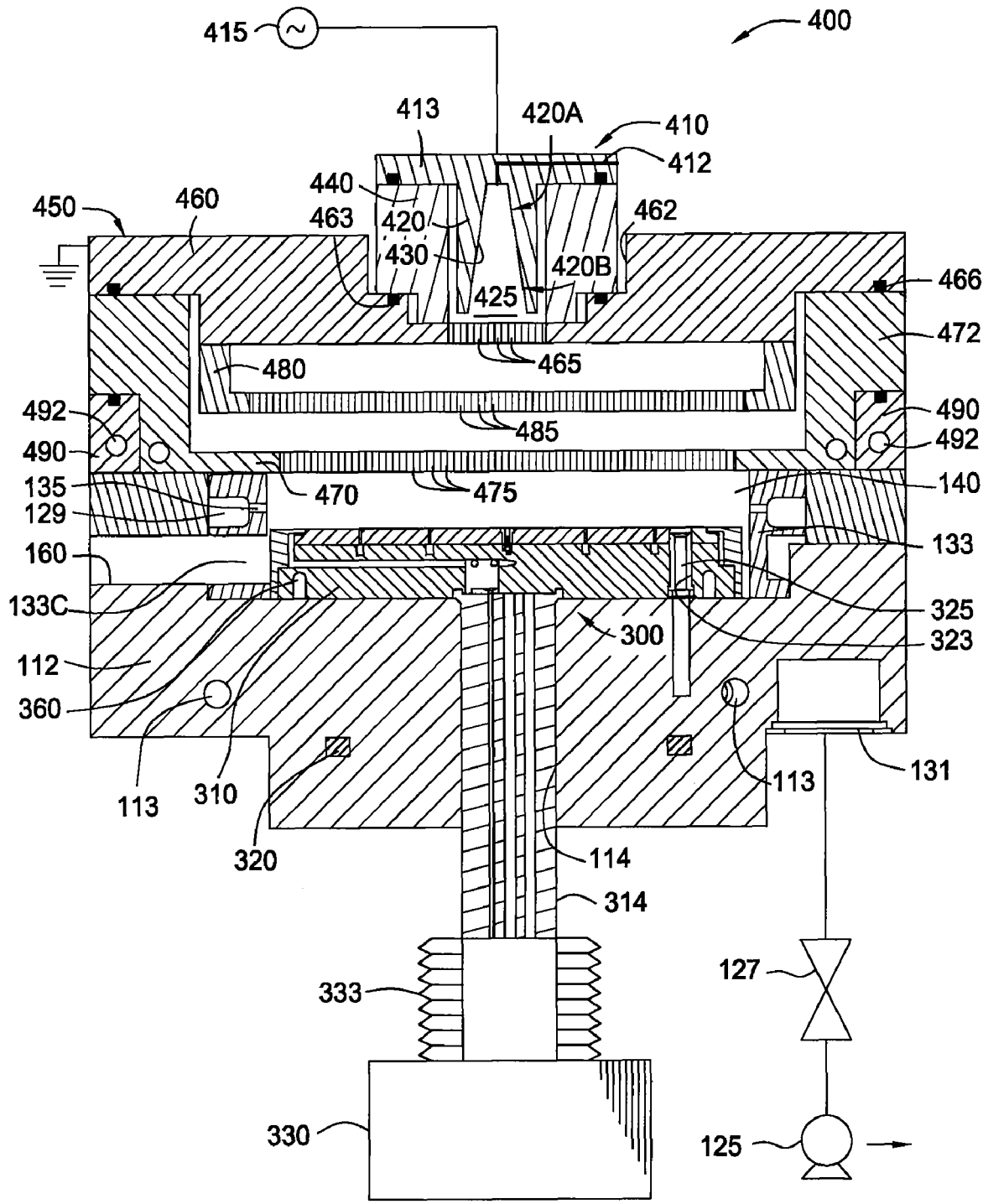
FIG. 4C shows a partial cross sectional view of the illustrative processing chamber 100 utilizing the lid assembly 400 of FIG. 4A.

FIG. 4C shows a partial cross sectional view of the chamber body 112 having the lid assembly 400 disposed thereon. Preferably, the expanding section 420 is centered above the support assembly 300 as shown in FIG. 4C. The confinement of the plasma within the plasma cavity 425 and the central location of the confined plasma allows an even and repeatable distribution of the disassociated gas(es) into the chamber body 112. Particularly, the gas leaving the plasma volume 425 flows through the apertures 465 of the top plate 460 to the upper surface of the blocker plate 480. The apertures 485 of the blocker plate 480 distribute the gas to the backside of the distribution plate 470 where the gas is further distributed through the apertures 475 of the distribution plate 470 before contacting the substrate (not shown) within the chamber body 112.

It is believed that the confinement of the plasma within the centrally located plasma cavity 425 and the variable distance between the first electrode 410 and the second electrode 450 generate a stable and reliable plasma within the lid assembly 400.

For simplicity and ease of description, an exemplary dry etch process for removing silicon oxide using an ammonia ($NH_3$) and nitrogen trifluoride ($NF_3$) gas mixture performed within the processing chamber 100 will now be described. It is believed that the processing chamber 100 is advantageous for any dry etch process that benefits from a plasma treatment in addition to both substrate heating and cooling all within a single processing environment, including an anneal process.

Referring to FIG. 1, the dry etch process begins by placing a substrate (not shown), such as a semiconductor substrate for example, into the processing chamber 100. The substrate is typically placed into the chamber body 112 through the slit valve opening 160 and disposed on the upper surface of the support member 310. The substrate is chucked to the upper surface of the support member 310, and an edge purge is passed through the channel 334. Preferably, the substrate is chucked to the upper surface of the support member 310 by pulling a vacuum through the holes 312 and grooves 316 that are in fluid communication with a vacuum pump via conduit 313. The support member 310 is then lifted to a processing position within the chamber body 112, if not already in a processing position. The chamber body 112 is preferably maintained at a temperature of between 50° C. and 80° C., more preferably at about 65° C. This temperature of the chamber body 112 is maintained by passing a heat transfer medium through the fluid channel 113.

The substrate is cooled below 65° C., such as between 15° C. and 50° C., by passing a heat transfer medium or coolant through the fluid channel 360 formed within the support assembly 300. In one embodiment, the substrate is maintained below room temperature. In another embodiment, the substrate is maintained at a temperature of between 22° C. and 40° C. Typically, the support member 310 is maintained below about 22° C. to reach the desired substrate temperatures specified above. To cool the support member 310, the coolant is passed through the fluid channel 360. A continuous flow of coolant is preferred to better control the temperature of the support member 310. The coolant is preferably 50 percent by volume ethylene glycol and 50 percent by volume water. Of course, any ratio of water and ethylene glycol can be used so long as the desired temperature of the substrate is maintained.

The ammonia and nitrogen trifluoride gases are then introduced into the chamber 100 to form a cleaning gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of the chamber body 112, as well as the capabilities of the vacuum system coupled to the chamber body 112. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). Preferably, the gases are introduced in the chamber 100 at a molar ratio of from 5:1 (ammonia to nitrogen trifluoride) to 30:1. More preferably, the molar ratio of the gas mixture is of from about 5 to 1 (ammonia to nitrogen trifluoride) to about 10 to 1. The molar ratio of the gas mixture may also fall between about 10:1 (ammonia to nitrogen trifluoride) and about 20:1.

A purge gas or carrier gas may also be added to the gas mixture. Any suitable purge gas/carrier gas may be used, such as argon, helium, hydrogen, nitrogen, or mixtures thereof, for example. Typically, the overall gas mixture is from about 0.05% to about 20% by volume of ammonia and nitrogen trifluoride. The remainder being the carrier gas. In one embodiment, the purge or carrier gas is first introduced into the chamber body 112 before the reactive gases to stabilize the pressure within the chamber body 112.

The operating pressure within the chamber body 112 can be variable. Typically, the pressure is maintained between about 500 milliTorr and about 30 Torr. Preferably, the pressure is maintained between about 1 Torr and about 10 Torr. More preferably, the operating pressure within the chamber body 112 is maintained between about 3 Torr and about 6 Torr.

An RF power of from about 5 watts and about 600 watts is applied to the electrode 240 to ignite a plasma of the gas mixture within the volumes 261, 262, and 263 contained in the gas delivery assembly 220. Preferably, the RF power is less than 100 watts. More preferable is that the frequency at which the power is applied is very low, such as less than 100 kHz. Preferably, the frequency ranges from about 50 kHz to about 90 kHz.

The plasma energy dissociates the ammonia and nitrogen trifluoride gases into reactive species that combine to form a highly reactive ammonium fluoride ($NH_4F$) and/or ammonium hydrogen fluoride ($NH_4 \cdot HF_2$) in the gas phase. These molecules then flow through the gas delivery assembly 220 via the holes 225A of the distribution plate 225 to react with the substrate surface to be cleaned. In one embodiment, the carrier gas is first introduced into the chamber 100, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4 \cdot HF_2$, reacts with the silicon oxide surface to form ammonium hexafluorosilicate ($(NH_4)_2SiF_6$), $NH_3$, and $H_2O$ as products. The $NH_3$ and $H_2O$ are vapors at processing conditions and removed from the chamber 100 by the vacuum pump 125. In particular, the volatile gases flow through the apertures 135 formed in the liner 133 into the pumping channel 129 before the gases exit the chamber 100 through the vacuum port 131 into the vacuum pump 125. A thin film of $(NH_4)_2SiF_6$ is left behind on the substrate surface. This reaction mechanism can be summarized as follows:

$$NF_3 + NH_3 \rightarrow NH_4F + NH_4 \cdot HF_2 + N_2$$

$$NH_4F + SiO_2 \rightarrow (NH_4)_2SiF_6 + H_2O$$

$$(NH_4)_2SiF_6 + heat \rightarrow NH_3 + HF + SiF_4$$

After the thin film is formed on the substrate surface, the support member 310 having the substrate supported thereon is elevated to an anneal position in close proximity to the heated distribution plate 225. The heat radiated from the distribution plate 225 should be sufficient to dissociate or sublimate the thin film of $(NH_4)_2SiF_6$ into volatile $SiF_4$, $NH_3$, and HF products. These volatile products are then removed from the chamber 100 by the vacuum pump 125 as described above. Typically, a temperature of 75° C. or more is used to effectively sublimate and remove the thin film from the substrate. Preferably, a temperature of 100° C. or more is used, such as between about 115° C. and about 200° C.

The thermal energy to dissociate the thin film of $(NH_4)_2SiF_6$ into its volatile components is convected or radiated by the distribution plate 225. As described above, a heating element 270 is directly coupled to the distribution plate 225, and is activated to heat the distribution plate 225 and the components in thermal contact therewith to a temperature between about 75° C. and 250° C. In one aspect, the distribution plate 225 is heated to a temperature of between 100° C. and 150° C., such as about 120° C.

This elevation change can be effectuated various ways. For example, the lift mechanism 330 can elevate the support member 310 toward a lower surface of the distribution plate 225. During this lifting step, the substrate is secured to the support member 310, such as by the vacuum chuck or electrostatic chuck described above. Alternatively, the substrate can be lifted off the support member 310 and placed in close proximity to the heated distribution plate 225 by elevating the lift pins 325 via the lift ring 320.

The distance between the upper surface of the substrate having the thin film thereon and the distribution plate 225 is not critical and is a matter of routine experimentation. A person of ordinary skill in the art can easily determine the spacing required to efficiently and effectively vaporize the thin film without damaging the underlying substrate. It is believed, however, that a spacing of between about 0.254 mm (10 mils) and 5.08 mm (200 mils) is effective.

Once the film has been removed from the substrate, the chamber is purged and evacuated. The cleaned substrate is then removed from the chamber body 112 by lowering the substrate to the transfer position, de-chucking the substrate, and transferring the substrate through the slit valve opening 160.

A system controller (not shown) can be used to regulate the operations of the processing chamber 100. The system controller can operate under the control of a computer program stored on a hard disk drive of a computer. For exemplary, the computer program can dictate the process sequencing and timing, mixture of gases, chamber pressures, RF power levels, susceptor positioning, slit valve opening and closing, wafer cooling and other parameters of a particular process. The interface between a user and the system controller can be made via a CRT monitor and light pen (not shown). In a preferred embodiment, two monitors are used, one monitor mounted in the clean room wall for the operators and the other monitor behind the wall for the service technicians. Also preferred is that both monitors simultaneously display the same information but only one light pen is enabled. The light pen detects light emitted by the CRT display with a light sensor in the tip of the pen. To select a particular screen or function, the operator can touch a designated area of the display screen and push the button on the pen. The display screen generally confirms communication between the light pen and the touched area by changing its appearance, e.g. highlight or color, or displaying a new menu or screen.

A variety of processes can be implemented using a computer program product that runs on, for example, the system controller. The computer program code can be written in any conventional computer readable programming language such as for example 68000 assembly language, C, C++, or PASCAL. Suitable program code can be entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked compiled object code, the system user invokes the object code, causing the computer system to load the code in memory, from which the CPU reads and executes the code to perform the tasks identified in the program.

FIGS. 5A-5H are sectional schematic views of an exemplary fabrication sequence for forming an exemplary active electronic device, such as a MOSFET structure 500, utilizing the dry etch process and the processing chamber 100 described herein. Referring to FIGS. 5A-5H, the exemplary MOSFET structure may be formed on a semiconductor material, for example a silicon or gallium arsenide substrate 525. Preferably, the substrate 525 is a silicon wafer having a <100> crystallographic orientation and a diameter of 150 mm (6 inches), 200 mm (8 inches), or 300 mm (12 inches). Typically, the MOSFET structure includes a combination of (i) dielectric layers, such as silicon dioxide, organosilicate, carbon doped silicon oxide, phosphosilicate glass (PSG), borophosphosilicate glass (BPSG), silicon nitride, or combinations thereof; (ii) semiconducting layers such as doped polysilicon, and n-type or p-type doped monocrystalline silicon; and (iii) electrical contacts and interconnect lines formed from layers of metal or metal silicide, such as tungsten, tungsten silicide, titanium, titanium silicide, cobalt silicide, nickel silicide, or combinations thereof.

Figure 5A:
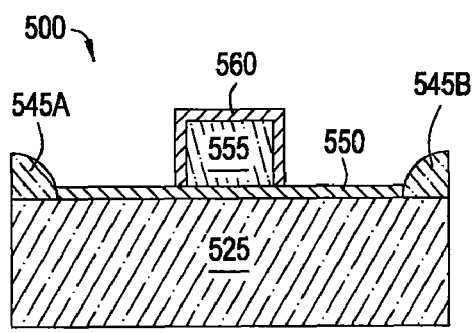
FIGS. 5A-5H are sectional schematic views of a fabrication sequence for forming an illustrative active electronic device, such as a MOSFET structure.

Referring to FIG. 5A, fabrication of the active electronic device begins by forming electrical isolation structures that electrically isolate the active electronic device from other devices. There are several types of electrical isolation structures as generally described in VLSI Technology, Second Edition, Chapter 11, by S. M. Sze, McGraw-Hill Publishing Company (1988), which is incorporated herein by reference. In one version, a field oxide layer (not shown) having a thickness of about 2,000 Å is first grown over the entire substrate 525, and portions of the oxide layer are removed to form the field oxide barriers 545A,B which surround exposed regions in which the electrically active elements of the device are formed. The exposed regions are thermally oxidized to form a thin gate oxide layer 550 having a thickness of from about 50 Å to about 300 Å. A polysilicon layer is then deposited, patterned, and etched to create a gate electrode 555. The surface of the polysilicon gate electrode 555 can be reoxidized to form an insulating dielectric layer 560, providing the structure shown in FIG. 5A.

Figure 5E:
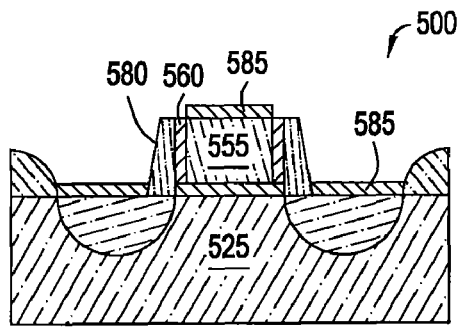
Figure 5B:
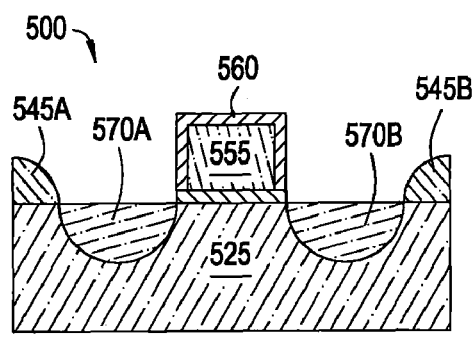

Referring to FIG. 5B, the source and drain regions 570A,B are next formed by doping the appropriate regions with suitable dopant atoms. For example, on p-type substrates 525, an n-type dopant species comprising arsenic or phosphorous is used. Typically the doping is performed by an ion implanter and might include, for example, phosphorous ($^{31}$P) at a concentration of about $10^{13}$ atoms/cm$^2$ at an energy level of from about 30 keV to about 80 keV, or arsenic ($^{75}$As) at a dose of from about $10^{15}$ to $10^{17}$ atoms/cm$^2$ and an energy of from 10 keV to 100 keV. After the implantation process, the dopant is driven into the substrate 525 by heating the substrate, for example, in a rapid thermal processing (RTP) apparatus. Thereafter, the oxide layer 550 covering the source and drain regions 570A,B is stripped in a conventional stripping process to remove any impurities caused by the implantation process which are trapped in the oxide layer, providing the structure shown in FIG. 8B.

Figure 5F:
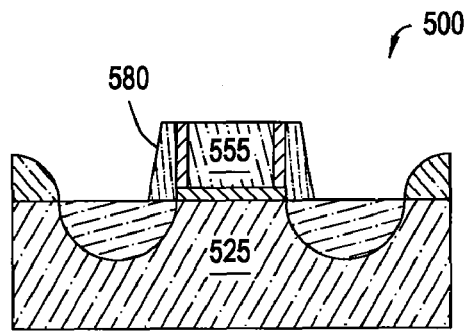
Figure 5C:
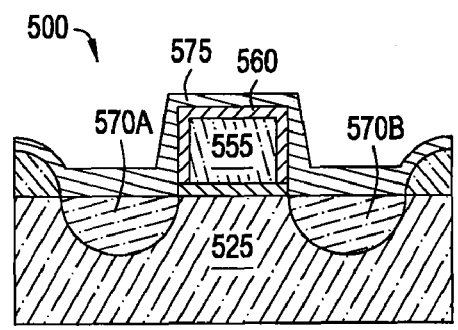
Figure 5G:
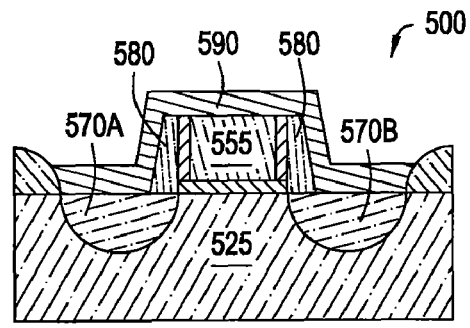
Figure 5D:
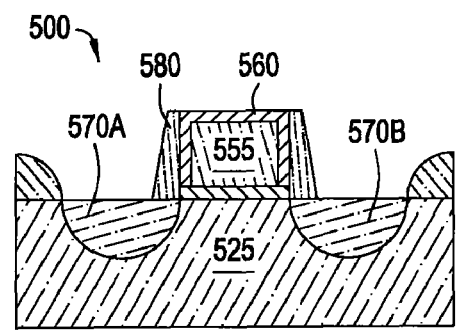

Referring to FIGS. 5C-5D, a silicon nitride layer 575 is deposited on the gate electrode 555 and the surfaces on the substrate 525 by low-pressure chemical vapor deposition (LPCVD) using a gas mixture of $SiH_4$, $Cl_2$, and $NH_3$. The silicon nitride layer 575 is then etched using reactive ion etching (RIE) techniques to form nitride spacers 580 on the sidewall of the gate electrode 555, as shown in FIG. 5D. The spacers 580 electrically isolate the silicide layer formed on the top surface of the gate 555 from other silicide layers deposited over the source 570A and drain 570B. It should be noted that the electrical isolation sidewall spacers 580 and overlayers can be fabricated from other materials, such as silicon oxide. The silicon oxide layers used to form sidewall spacers 580 are typically deposited by CVD or PECVD from a feed gas of tetraethoxysilane (TEOS) at a temperature in the range of from about 600° C. to about 1,000° C.

Referring to FIG. 5E, a native silicon oxide layer 585 is formed on exposed silicon surfaces by exposure to the atmosphere before and after the processes. The native silicon oxide layer 585 must be removed prior to forming conductive metal silicide contacts on the gate 555, source 570A, and drain 570B to improve the alloying reaction and electrical conductivity of the metal silicide formed. The native silicon oxide layer 585 can increase the electrical resistance of the semiconducting material, and adversely affect the silicidation reaction of the silicon and metal layers that are subsequently deposited. Therefore, it is necessary to remove this native silicon dioxide layer 585 using the dry etch process described prior to forming metal silicide contacts or conductors for interconnecting active electronic devices. The dry etch process removes the native silicon oxide layers 585 to expose the source 570A, drain 570B, and the top surface of the gate electrode 555 as shown in FIG. 5F.

Thereafter, as illustrated in FIG. 5G, a plasma vapor deposition (PVD) sputtering process is used to deposit a layer of metal 590. Conventional furnace annealing is then used to anneal the metal and silicon layers to form metal silicide in regions in which the metal layer 590 is in contact with silicon. The anneal is typically performed in a separate processing system. Accordingly, a protective cap layer (not shown) may be deposited over the metal 590. The cap layers are typically nitride materials and may contain one or more materials, such as titanium nitride, tungsten nitride, tantalum nitride, hafnium nitride, and silicon nitride. The cap layer may be deposited by any deposition process, preferably by PVD.

Annealing typically involves heating the substrate 500 to a temperature of between 600° C. and 800° C. in an atmosphere of nitrogen for about 30 minutes. Alternatively, the metal silicide 595 can be formed utilizing a rapid thermal annealing process in which the substrate 500 is rapidly heated to about 1,000° C. for about 30 seconds. Suitable conductive metals include cobalt, titanium, nickel, tungsten, platinum, and any other metal that has a low contact resistance and that can form a reliable metal silicide contact on both polysilicon and monocrystalline silicon.

Figure 5H:
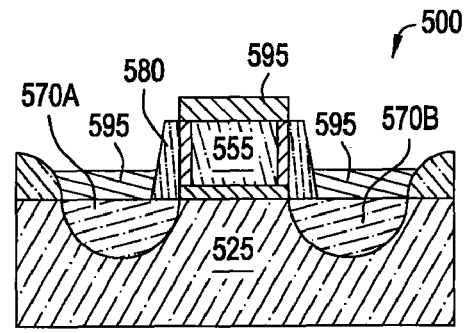

Unreacted portions of the metal layer 590 can be removed by a wet etch using aqua regia, (HCl and $HNO_3$) which removes the metal without attacking the metal silicide 595; the spacer 580, or the field oxide 545A,B, thus leaving a self-aligned metal silicide contact 595 on the gate 555, source 570A, and drain 570B, as shown in FIG. 5H. Thereafter, an insulating cover layer comprising, for example, silicon oxide, BPSG, or PSG, can be deposited on the electrode structures. The insulating cover layer is deposited by means of chemical-vapor deposition in a CVD chamber, in which the material condenses from a feed gas at low or atmospheric pressure, as for example, described in commonly assigned U.S. Pat. No. 5,500,249, which is incorporated herein by reference. Thereafter, the structure 500 is annealed at glass transition temperatures to form a smooth planarized surface.

In one or more embodiments, the processing chamber 100 can be integrated into a multi-processing platform, such as an ENDURA® platform available from Applied Materials, Inc., located in Santa Clara, Calif. Such a processing platform is capable of performing several processing operations without breaking vacuum. Details of the ENDURA® platform are described in commonly assigned U.S. Ser. No. 09/451,628, entitled "Integrated Modular Processing Platform," filed on Nov. 30, 1999, which is incorporated by reference herein.

Figure 6:
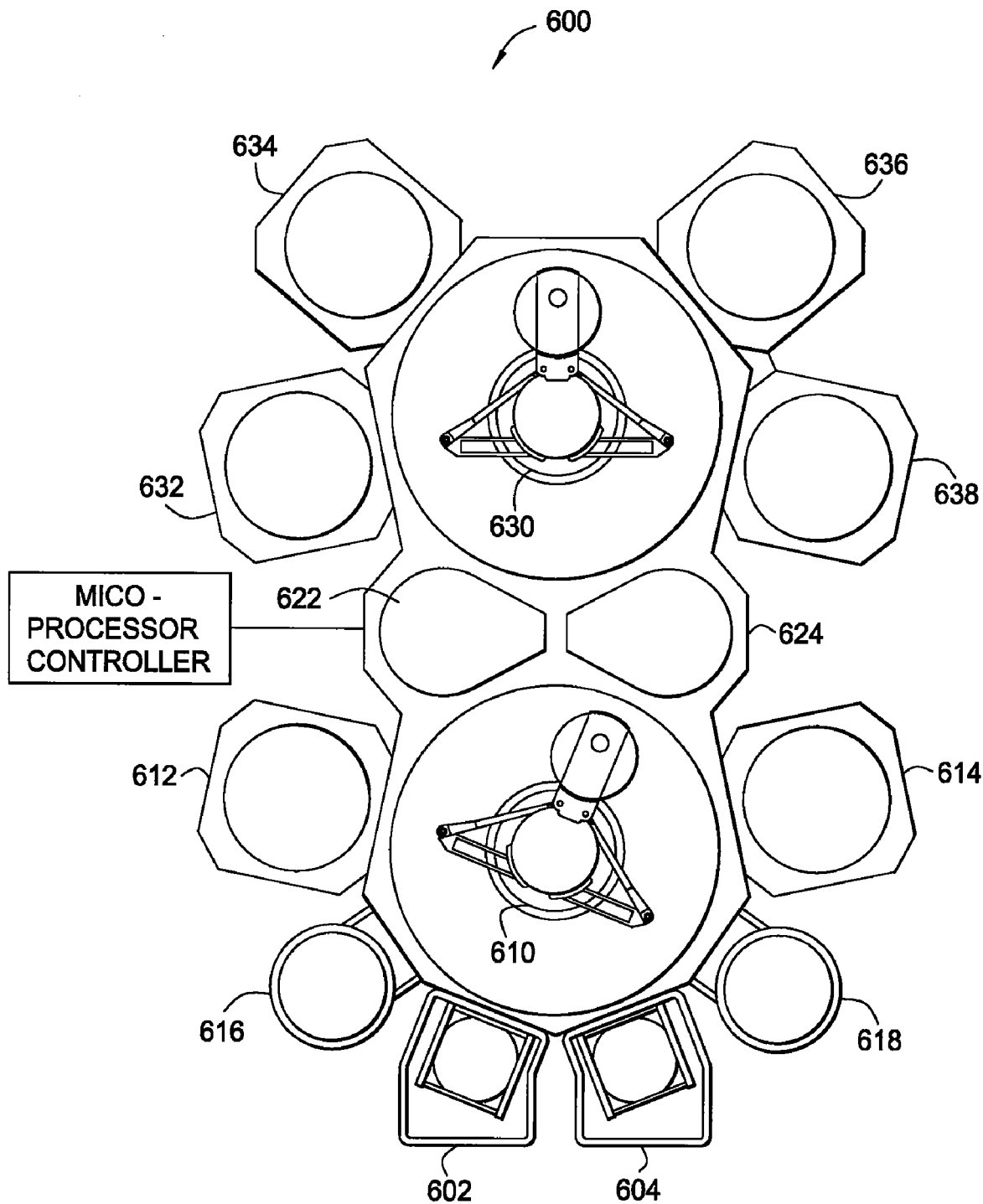
FIG. 6 is a schematic diagram of an exemplary multi-chamber processing system adapted to perform multiple processing operations.

FIG. 6 is a schematic top-view diagram of an illustrative multi-chamber processing system 600. The system 600 can include one or more load lock chambers 602, 604 for transferring of substrates into and out of the system 600. Typically, since the system 600 is under vacuum, the load lock chambers 602, 604 may "pump down" the substrates introduced into the system 600. A first robot 610 may transfer the substrates between the load lock chambers 602, 604, and a first set of one or more substrate processing chambers 612, 614, 616, 618 (four are shown). Each processing chamber 612, 614, 616, 618, can be outfitted to perform a number of substrate processing operations including the dry etch processes described herein in addition to cyclical layer deposition (CLD), atomic layer deposition (ALD), CVD, PVD, etch, pre-clean, degas, orientation and other substrate processes.

The first robot 610 can also transfer substrates to/from one or more transfer chambers 622, 624. The transfer chambers 622, 624 can be used to maintain ultrahigh vacuum conditions while allowing substrates to be transferred within the system 600. A second robot 630 can transfer the substrates between the transfer chambers 622, 624 and a second set of one or more processing chambers 632, 634, 636, 638. Similar to processing chambers 612, 614, 616, 618, the processing chambers 632, 634, 636, 638 can be outfitted to perform a variety of substrate processing operations including the dry etch processes described herein in addition to CLD, ALD, CVD, PVD, etch, pre-clean, degas, and orientation, for example. Any of the substrate processing chambers 612, 614, 616, 618, 632, 634, 636, 638 may be removed from the system 600 if not necessary for a particular process to be performed by the system 600.

An illustrative multi-processing system 600 for forming the MOSFET structure of FIGS. 5A-5H can include two processing chambers 100 as described above, two physical vapor deposition chambers to deposit the metal 500 and two physical vapor deposition chambers to deposit the optional cap layer (not shown). Any one of the processing chambers 612, 614, 616, 618, 632, 634, 636, 638 shown in FIG. 6 represent the PVD chambers and/or processing chambers 100.

Although the process sequence above has been described in relation to the formation of a MOSFET device, the dry etch process described herein can also be used to form other semiconductor structures and devices that have other metal silicide layers, for example, silicides of tungsten, tantalum, molybdenum. The cleaning process can also be used prior to the deposition of layers of different metals including, for example, aluminum, copper, cobalt, nickel, silicon, titanium, palladium, hafnium, boron, tungsten, tantalum, or mixtures thereof.

To provide a better understanding of the foregoing discussion, the following non-limiting example is offered. Although the example may be directed to specific embodiments, the example should not be interpreted as limiting the invention in any specific respect.

EXAMPLE

During etch, a gas mixture of 2 sccm of $NF_3$, 10 sccm of $NH_3$ and 2,500 sccm of argon was introduced into the chamber. A plasma of the gas mixture was ignited using 100 watts of power. The bottom purge was 1,500 sccm of argon and the edge purge was 50 sccm of argon. The chamber pressure was maintained at about 6 Torr, and the substrate temperature was about 22° C. The substrate was etched for 120 seconds.

During subsequent annealing, the spacing was 750 mil and the lid temperature was 120° C. The substrate was annealed for about 60 seconds. About 50 Å of material was removed from the substrate surface. No anneal effect was observed. The etch rate was about 0.46 Å per second (28 Å/min). The observed etch uniformity was about 5% for the 50 Å etch.

Unless otherwise indicated, all numbers expressing quantities of ingredients, properties, reaction conditions, and so forth, used in the specification and claims are to be understood as approximations. These approximations are based on the desired properties sought to be obtained by the present invention, and the error of measurement, and should at least be construed in light of the number of reported significant digits and by applying ordinary rounding techniques. Further, any of the quantities expressed herein, including temperature, pressure, spacing, molar ratios, flow rates, and so on, can be further optimized to achieve the desired etch selectivity and particle performance.

While the foregoing is directed to embodiments of the invention, other and further embodiments of the invention may be devised without departing from the basic scope thereof, and the scope thereof is determined by the claims that follow.

The invention claimed is:

1. A method for removing silicon oxides from a substrate surface, comprising:
   positioning a substrate comprising exposed silicon oxide in a first position within a processing chamber, the first position spaced a first distance from a gas distribution plate coupled to the chamber;
   generating a plasma of reactive species from a gas mixture within the processing chamber;
   contacting the exposed silicon oxide on the substrate with reactive species while forming a film on the substrate at a first temperature of less than about 65° C.;
   moving the substrate into a second position within the processing chamber, the second position located a second distance from the gas distribution plate, the second distance being less than the first distance; and
   heating the substrate to a second temperature of about 100° C. or greater within the processing chamber at the second position to sublimate the film.

2. The method of claim 1, wherein the film comprises ammonium hexafluorosilicate.

3. The method of claim 1, wherein the gas mixture comprises ammonia, nitrogen trifluoride, and a carrier gas.

4. The method of claim 3, wherein the gas mixture comprises a total volume of the ammonia and the nitrogen trifluoride within a range from about 0.05% to about 20%.

5. The method of claim 1, wherein the first temperature is about room temperature or less.

6. The method of claim 5, wherein the first temperature is about 22° C. or less.

7. The method of claim 1, wherein the first temperature is within a range from about 15° C. to about 50° C.

8. The method of claim 7, wherein the first temperature is within a range from about 22° C. to about 40° C.

9. The method of claim 1, wherein heating the substrate comprises positioning the substrate adjacent a heated gas distribution plate disposed within the processing chamber.

10. The method of claim 9, wherein the second temperature is within a range from about 115° C. to about 200° C.

11. The method of claim 9, wherein the second temperature is about 120° C.

12. The method of claim 9, wherein the second position is located within a range from about 10 mils to about 200 mils from the heated gas distribution plate.

13. The method of claim 1, wherein the gas mixture comprises a molar ratio of ammonia to nitrogen trifluoride of at least 3:1.

14. The method of claim 13, wherein the molar ratio of ammonia to nitrogen trifluoride is within a range from about 5:1 to about 30:1.

15. The method of claim 1, wherein the gas distribution plate is heated to a temperature within a range from about 100° C. to about 150° C. while heating the substrate within the processing chamber to sublimate the film.

16. The method of claim 15, wherein the substrate is located from the gas distribution plate a distance within a range from about 10 mils to about 200 mils.

17. A method for removing silicon oxides from a substrate surface within a processing chamber, comprising:
   generating a plasma of reactive species from a gas mixture within the processing chamber, wherein the plasma comprises ammonium fluoride or ammonium hydrogen fluoride;
   exposing a silicon oxide surface on a substrate located in a first position to the plasma at a first temperature of less than about 65° C. while forming a film comprising ammonium hexafluorosilicate, the first position spaced a first distance from a gas distribution plate coupled to the chamber;
   heating the gas distribution plate within the processing chamber;
   positioning the substrate in a second position, the second position located a second distance from the gas distribution plate, the second distance being less than the first distance and within a range from about 10 mils to about 200 mils from the gas distribution plate; and
   heating the substrate to a second temperature of about 100° C. or greater within the processing chamber at the second position to sublimate the film.

18. The method of claim 17, wherein the gas mixture comprises ammonia, nitrogen trifluoride, and a carrier gas.

19. The method of claim 18, wherein the gas mixture comprises a total volume of the ammonia and the nitrogen trifluoride within a range from about 0.05% to about 20%.

20. The method of claim 17, wherein the first temperature is about 22° C. or less.

21. The method of claim 17, wherein the first temperature is within a range from about 15° C. to about 50° C.

22. The method of claim 21, wherein the second temperature is about 120° C.

23. The method of claim 17, wherein the gas mixture comprises a molar ratio of ammonia to nitrogen trifluoride of at least 3:1.

24. The method of claim 23, wherein the molar ratio of ammonia to nitrogen trifluoride is within a range from about 5:1 to about 30:1.

25. A method for removing silicon oxides from a substrate surface, comprising:
   supporting a substrate in a first position, the substrate comprising a silicon oxide surface within a processing chamber, the first position spaced a first distance from a gas distribution plate coupled to the chamber;
   generating a plasma of reactive species from a gas mixture within the processing chamber, wherein the gas mixture comprises ammonia, nitrogen trifluoride, and a carrier gas and the gas mixture comprises a total volume of the ammonia and the nitrogen trifluoride within a range from about 0.05% to about 20%;

cooling the substrate to a first temperature of less than about 65° C. within the processing chamber;

exposing the silicon oxide surface on the cooled substrate to reactive species while forming a film on the substrate;

moving the substrate to a second position within the processing chamber, the second position located a second distance from the gas distribution plate, the second distance being less than the first distance; and heating the substrate to a second temperature of about 100° C. or greater within the processing chamber to sublimate the film.

26. The method of claim 25, wherein the second temperature is within a range from about 115° C. to about 200° C., and the operating pressure within the chamber is within a range from about 500 milliTorr to about 30 Torr while heating substrate.

27. The method of claim 26, wherein the second distance is within a range from about 10 mils to about 200 mils from the gas distribution plate.

28. The method of claim 27, wherein the first temperature is within a range between about 22° C. and 40° C., and the second temperature is within a range from about 115° C. and 200° C.

* * * * *

UNITED STATES PATENT AND TRADEMARK OFFICE
CERTIFICATE OF CORRECTION

PATENT NO. : 7,767,024 B2
APPLICATION NO. : 12/134715
DATED : August 3, 2010
INVENTOR(S) : Kao et al.

It is certified that error appears in the above-identified patent and that said Letters Patent is hereby corrected as shown below:

Column 16, Line 39, please delete "$NH_4.HF_2$" and insert --$NH_4 \cdot HF_2$-- therefor;

Column 16, Line 51, please delete "$NF_3+NH_3 \rightarrow NH_4F+NH_4.HF_2+N_2$" and insert --$NF_3+NH_3 \rightarrow NH_4F+NH_4 \cdot HF_2+N_2$-- therefor.

Signed and Sealed this

Seventh Day of December, 2010

David J. Kappos
*Director of the United States Patent and Trademark Office*